US006564285B1

(12) United States Patent
Mills et al.

(10) Patent No.: US 6,564,285 B1
(45) Date of Patent: May 13, 2003

(54) SYNCHRONOUS INTERFACE FOR A NONVOLATILE MEMORY

(75) Inventors: Duane R. Mills, Folsom, CA (US); Brian Lyn Dipert, Sacramento, CA (US); Sachidanandan Sambandan, Folsom, CA (US); Bruce McCormick, Roseville, CA (US); Richard D. Pashley, Roseville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/595,327

(22) Filed: Jun. 14, 2000

Related U.S. Application Data

(63) Continuation of application No. 08/877,840, filed on Jun. 18, 1997, which is a continuation of application No. 08/253,499, filed on Jun. 3, 1994, now Pat. No. 5,696,917.

(51) Int. Cl.7 .............................................. G06F 12/00
(52) U.S. Cl. ....................... 711/103; 711/101; 711/102; 711/167; 711/168; 711/169
(58) Field of Search ................. 711/100–106, 200–206, 711/167–169

(56) References Cited

U.S. PATENT DOCUMENTS

| 4,034,354 A | 7/1977 | Simmons .................... 364/140 |
| 4,089,052 A | 5/1978 | Gruner ........................ 711/167 |
| 4,307,447 A | 12/1981 | Provanzano et al. ........ 364/130 |
| 4,596,004 A | 6/1986 | Kaufman .................... 365/233 |
| 4,630,230 A | 12/1986 | Sundet ........................ 711/169 |
| 4,785,428 A | 11/1988 | Bajwa et al. ................ 365/233 |
| 4,813,018 A | 3/1989 | Kobayashi et al. ..... 365/185.08 |
| 4,816,814 A | 3/1989 | Lumelsky .................... 345/135 |
| 4,847,758 A | 7/1989 | Olson et al. ................ 711/133 |
| 4,918,587 A | 4/1990 | Pechter et al. .............. 711/218 |
| 4,945,535 A | 7/1990 | Hosotani et al. ................ 714/8 |
| 4,947,380 A | 8/1990 | Van Zanten et al. ........ 365/238 |
| 5,036,460 A | 7/1991 | Takahira et al. ............. 711/103 |
| 5,097,445 A | 3/1992 | Yamauchi ............... 365/185.04 |
| 5,101,490 A | 3/1992 | Getson, Jr. et al. ........... 710/15 |
| 5,146,546 A | 9/1992 | Neuhard et al. ............. 395/115 |
| 5,193,162 A | 3/1993 | Bordsen et al. ............. 711/152 |
| 5,197,034 A | 3/1993 | Fandrich et al. ............ 365/227 |

(List continued on next page.)

FOREIGN PATENT DOCUMENTS

| GB | 2 251 324 A | 7/1992 |
| JP | 56-54532 | 5/1981 |
| JP | 4-372030 | 12/1992 |
| JP | 5-334168 | 12/1993 |

OTHER PUBLICATIONS

Arnold, "Intel flash now boots a BIOS; block–oriented part coud hold other routines", EDN, vol. 36, No. 10A, May 16, 1991, p. 3 (2 pgs.).

Case, Brian and Michael Slater, "DEC enters microprocessor busines with Alpha; DEC to sell chips on open market," Microprocessor Report, vol. 6, No. 3, Mar. 4, 1992, p. 1 (7 pgs.).

(List continued on next page.)

Primary Examiner—Than Nguyen
(74) Attorney, Agent, or Firm—Blakely, Sokoloff, Taylor & Zafman LLP

(57) ABSTRACT

A flash memory chip that can be switched into four different read modes is described. In asynchronous flash mode, the flash memory is read as a standard flash memory. In synchronous flash mode, a clock signal is provided to the flash chip and a series of addresses belonging to a data burst are specified, one address per clock period. The data stored at the specified addresses are output sequentially during subsequent clock periods. In asynchronous DRAM mode, the flash memory emulates DRAM. In synchronous DRAM mode the flash memory emulates synchronous DRAM.

18 Claims, 14 Drawing Sheets

U.S. PATENT DOCUMENTS

| | | | |
|---|---|---|---|
| 5,249,187 A | 9/1993 | Bruckert et al. | 714/11 |
| 5,251,227 A | 10/1993 | Bruckert et al. | 714/23 |
| 5,261,064 A | 11/1993 | Wyland | 711/211 |
| 5,263,003 A | 11/1993 | Cowles et al. | 365/230.03 |
| 5,265,218 A | 11/1993 | Testa et al. | 710/100 |
| 5,276,812 A | 1/1994 | Yamada et al. | 711/105 |
| 5,287,457 A | 2/1994 | Arimilli et al. | 710/128 |
| 5,291,580 A | 3/1994 | Bowden et al. | 711/5 |
| 5,297,148 A | 3/1994 | Harari et al. | 714/710 |
| 5,302,866 A | 4/1994 | Chiang et al. | 326/40 |
| 5,306,963 A | 4/1994 | Leak et al. | 327/14 |
| 5,307,314 A | 4/1994 | Lee | 365/89.04 |
| 5,327,390 A | 7/1994 | Takasugi | 365/230.06 |
| 5,331,601 A | 7/1994 | Parris | 365/230.08 |
| 5,333,276 A | 7/1994 | Solari | 712/220 |
| 5,339,134 A | 8/1994 | Nakamura et al. | 799/367 |
| 5,357,459 A | 10/1994 | Chapman | 365/149 |
| 5,359,569 A | 10/1994 | Fujita et al. | 365/229 |
| 5,369,754 A | 11/1994 | Fandrich et al. | 711/103 |
| 5,379,384 A | 1/1995 | Solomon | 710/228 |
| 5,388,224 A | 2/1995 | Maskas | 710/104 |
| 5,388,248 A | 2/1995 | Robinson et al. | 365/52 |
| 5,404,338 A | 4/1995 | Murai | 365/233 |
| 5,404,485 A | 4/1995 | Ban | 711/202 |
| 5,414,820 A | 5/1995 | McFarland et al. | 710/128 |
| 5,418,752 A | 5/1995 | Harari et al. | 365/218 |
| 5,422,855 A | 6/1995 | Eslick et al. | 365/226 |
| 5,426,603 A | 6/1995 | Nakamura et al. | 365/149 |
| 5,428,579 A | 6/1995 | Robinson et al. | 365/230.03 |
| 5,430,849 A | 7/1995 | Banks | 710/38 |
| 5,448,521 A | 9/1995 | Curry et al. | 365/189.02 |
| 5,450,551 A | 9/1995 | Amini et al. | 710/119 |
| 5,453,957 A * | 9/1995 | Norris et al. | 365/230.04 |
| 5,465,367 A | 11/1995 | Reddy et al. | 365/222 |
| 5,471,632 A | 11/1995 | Gavin et al. | 710/104 |
| 5,491,827 A | 2/1996 | Holtey | 711/163 |
| 5,500,829 A | 3/1996 | Toda et al. | 365/230.08 |
| 5,526,311 A | 6/1996 | Kreifels et al. | 365/201 |
| 5,530,673 A | 6/1996 | Tobita et al. | 365/185.09 |
| 5,696,917 A * | 12/1997 | Mills et al. | 710/35 |
| 5,721,860 A | 2/1998 | Stolt et al. | 365/230.01 |
| 5,729,709 A | 3/1998 | Harness | 711/5 |
| 5,732,406 A * | 3/1998 | Bassett et al. | 711/104 |
| 5,787,047 A * | 7/1998 | Norris et al. | |
| 5,831,926 A * | 11/1998 | Norris et al. | |
| 5,966,731 A | 10/1999 | Barth et al. | 711/167 |
| 6,026,465 A * | 2/2000 | Mills et al. | 711/103 |

OTHER PUBLICATIONS

"Chips: Headland Technology zero wait state single chip system logic," Work–Group Computing Report, vol. 2, No. 72, Oct. 7, 1991, p. 63 (1 pg.).

Dalton, "Intel packs a computer on a chip: the 386 SL promises to make portables even more portable", Lotus, vol. 6, No. 12, Dec. 1990, p. 10 (2 pgs.).

Dipert, Brian and Marcus Levy, "Chapter 5: Hardware Interfacing to Flash Memory Components; Designing With Flash Memory; The definitive guide to designing flash memory hardware and software for components and PCM-CIA cards," Annabooks: San Diego, CA, Oct. 1993, pp. i–vii and 73–104.

Dipert, Brian, "28F008SA Hardware Interfacing," Intel Corporation's Mobile Computer Products: Chapter 4, Application Note Ap–359, Aug. 1992, pp. 4–299 to 4–309.

Dipert, Brian, "Flash Memory: Meeting the Needs of Mobile Computing," Intel Corporation's Flash Memory vol. ii: Chapter 10, Article Reprint AR–715, 1992, pp. 10–8 to 10–15.

"Flash Memory Overview," Intel Corporation's Flash Memory vol. 1: Chapter 2, Nov. 1992, pp. 2–1 to 2–6.

Forella, John, "Solid state memory: understanding the basics of non–volatile technology," Defense Electronics, vol. 26, No. 1, Jan. 1994, p. 34 (3 pgs.).

Grey, George, "The 88000 faces of Multibus II," ESD: The Electronic System Design Magazine, vol. 18, No. 9, Sep. 1988, p. 45 (6 pgs.).

Lavin, Paul, "Racing to the top: NEC's PowerMate 486/SE, with a look at the Apricot Qi 900", PC User, No. 131, Apr. 25, 1990, p. 83, (4 pgs.).

Martin, S. Louis, "486 chip sets due for AT, MCA, EISA: sets differ on burst–mose and second–level cache support (80486 microprocessor)," EDN, vol. 34, No. 34, No. 24A, Nov. 30, 1989, p. 1 (2 pgs.).

Patent Cooperation Treaty's International Search Report for International application No. PCT/US95/07062, dated Dec. 6, 1995, 6 pgs.

Patent Cooperation Treaty's Written Opinion for International application No. PCT/US95/07062, dated Jul. 23, 1996, 9 pgs.

Prince, Betty, "Memory in the Fast Lane," IEEE Spectrum, Feb. 1994, pp. 38–41.

Sama, Anil and Brian Dipert, "Power Supply Solutions for Flash Memory," Intel Corporation's Flash Memory vol. 1: Chapter 2, Application Note AP–357, Sep. 1993, pp. 2–7 to 2–41.

"Two–chip set based on 386SL core simplifies palmtop system designs (VLSI Technology Inc.'s VL86C300 and VL86C100 chips based on Intel Corp's 80386 microprocessor(," Electronic Design, vol. 41, No. 21, Oct. 14, 1993, p. 140 (2 pgs.).

Verner, Don, "Implementing Mobile PC Designs Using High Density FlashFile Components," Intel Corporation's Flash Memory vol. 1; Chapter 3, Application Note Ap–362, Oct. 1993, pp. 3–139 to 3–193.

Willett, Hugh G., "Moore: Flash's Rise is EPROM's Demise, Intel: Will not add EPROMs past 4–Mbit density," Electronic Buyers' News, Apr. 22, 1991, p. 1 (2 pgs.).

Wilson, "Vendors eye flash EPROM for role in one–chip microcomputers," Computer Design, vol. 28, No. 11, Jun. 1, 1989, pp. 3, 26, & 27 (3 pgs.).

Woods, Lynn A. and Aviel Livay, "Connect an FDDI peripheral to the Sbus," Electronic Design, vol. 41, No. 22, Nov. 1, 1993, p. 69 (8 pgs.).

Ziegler, Jeff, Tim Hornback and Anthony Jordan, "The ten commandments of debugging: when troubleshooting complex systems, don't make the job any tougher than it is—get back to the basics," Electronic Design, vol. 40, No. 18, Sep. 3, 1992, p. 61 (8 pgs.).

"27960CX: Pipeline Burst Access 1M(128K×8) EPROM," Intel Corporation, Order No. 290236–002, Oct. 1989, pp. 4–358 to 4–378.

"27960KX: Burst Access 1M (128K×8) EPROM,"ntel Corporation, Order No. 290237–002, Oct. 1989, pp. 4–379 to 4–396.

English language version of the Abstract of Japanese Patent # JP 5334168 A, published on Dec. 17, 1993 by Koichi et al. (1 pg.).

* cited by examiner

SYNCHRONOUS INTERFACE FOR A NONVOLATILE MEMORY

This is a continuation of application Ser. No. 08/877,840, filed Jun. 18, 1997, which is a continuation of application Ser. No. 08/253,499, filed Jun. 3, 1994, which issued as U.S. Pat. No. 5,696,917 on Dec. 9, 1997.

FIELD OF THE INVENTION

The present invention pertains to the field of the architecture of computer systems. More particularly, the present invention relates to computer systems that use a large-block erasable non-volatile semiconductor memory as main memory.

BACKGROUND OF THE INVENTION

As modern computer programs have become increasingly more sophisticated, modern personal computer systems have also had to become more sophisticated in order to accommodate these computer programs. Computer programs are made up of a larger number of code instructions than they once were and on average, require access to larger files of data that are read from, and written to, when executing the programs.

Typically, the heart of a personal computer system is a central processing unit (CPU) that resides on a microprocessor chip. New microprocessor chips that operate at increasingly high operating speeds are constantly being developed in order to permit personal computers to execute the larger programs in a timely manner. Usually, these microprocessor chips are developed using CMOS (complementary metal-oxide semiconductor) technology. The greatest amount of power consumption for CMOS chips occurs on the leading and trailing edges of dock pulses (i.e. when a clock signal transitions from a low voltage state to a higher voltage state and vice versa).

When the operating speed of the microprocessor is increased, the number of clock pulses in a particular time period increases thereby increasing the power consumption of the microprocessor during this time period. Furthermore, more heat is generated by the microprocessor and must be dissipated in order to prevent the damage of components within the computer system.

Both power consumption and heat dissipation pose serious problems when designing a personal computer system. This is especially true in the case of mobile computers that are typically powered by batteries. The more power that the computer consumes, the less time that the computer can operate off of a given sized battery. Therefore, as the operating speed of the computer is increased, a designer is faced with several unattractive alternatives.

If the same sized batteries are used, then the effective operating time for the computer system must decrease when the operating speed is increased. On the other hand, if the effective operating time is to remain constant then it is necessary to either add additional batteries, thereby increasing the bulk and weight of the computer, or to use. an exotic and therefore expensive battery technology (or both).

The trend in mobile computers is towards smaller, faster, less expensive and lighter units. Thus, the need to add additional batteries, or more expensive batteries is a significant disadvantage. This disadvantage is exacerbated by the need to add cooling fans, or to implement other cooling techniques, in order to dissipate the additional heat that is generated by the high speed microprocessors.

Additionally, because the microprocessors are operating at a higher speed, they can execute more instructions in a given amount of time, and therefore can also process a greater amount of data during that period. A bottle neck has developed in computer systems having fast microprocessors that can prevent the higher speed of the microprocessor to be utilized effectively. This bottle neck is the bus (or buses) that provide instructions for the microprocessor to execute and the data that the microprocessor will use when executing the instructions.

If the next instruction to be executed is not available when the microprocessor needs it, then the microprocessor must wait idly (i.e. insert wait cycles) while the required instruction is retrieved and provided to the microprocessor. Furthermore, if the next instruction to be executed requires data that is not immediately available to the microprocessor, the microprocessor must also idle until the data has been retrieved. During this idle time, the microprocessor clock continues to toggle thereby needlessly consuming power and generating heat that must be dissipated.

In order to decrease the frequency with which the microprocessor encounters these wait cycles, many modern high performance microprocessors have a small internal cache, called a primary cache. Instructions that are likely to be executed and data that is likely to be needed by the executing instructions are stored in the internal cache so that they may be accessed immediately by the CPU of the microprocessor.

The sequential nature of computer programs is such that when a particular instruction within the program is executed, it is highly probable that the next instruction to be executed will be the instruction that follows the currently executing instruction. Therefore, when an instruction is to be executed, the cache is checked to determine whether a copy of the required instruction is immediately available within the cache. If a copy of the required instruction is stored within the cache (called a cache hit), then the copy of the instruction can be supplied to the CPU immediately from the cache and there is no need for the CPU to wait while the instruction is retrieved to the microprocessor chip from wherever it is stored in the computer system.

On the other hand, if a copy of the required instruction is not stored within the cache (called a cache miss), then the CPU must wait while the instruction is retrieved to the microprocessor chip from wherever it is stored within the computer system. Actually, rather than only retrieving the next instruction to be executed, a cache line is formed by retrieving the next instruction to be executed and a certain number of instructions following the next instruction to be executed. That way, if the subsequent instructions are in fact required to be executed, they will be immediately available to the CPU from within the cache line of the cache. Because of the sequential nature of programs, the benefits of caching also applies to data used by the programs.

Because the internal cache is filled a cache line at a time, many microprocessors can accept data in a burst mode. In a typical burst read, the microprocessor specifies the first address of the data or instructions to be read into a cache line. Then, the data or instructions that are stored at the addresses of the cache line are sent sequentially from where they are stored within the computer system to the microprocessor.

Frequently the internal cache of the microprocessor is formed using static random access memory (SRAM). Because each SRAM cell is formed by six to eight transistors, there is only room on a microprocessor chip for a relatively small SRAM cache. Furthermore, SRAM is volatile meaning that SRAM retains the information stored as long as there is enough power to run the device. If power is removed, the contents of the SRAM cache are lost.

Some microprocessors are dynamic, meaning that if power is removed from them, when power is restored they cannot return directly to the state they were in when the power was removed. When power is restored the microprocessor must be reinitialized, and at least some of the processing progress previously made will probably be lost.

Other microprocessors are static, meaning that they can be placed in an energy saving deep powerdown mode, and then be returned relatively quickly to the state they were in immediately before they entered the deep powerdown mode.

As mentioned earlier, data and instructions are stored within the computer system and provided to the microprocessor over one (or more) bus systems. Because most types of relatively fast random access memory are both volatile and relatively expensive, a typical computer system stores code and data on relatively inexpensive, nonvolatile memory store such as a floppy disk or hard disk.

The typical computer system also has a main memory made of volatile memory because the nonvolatile memory has a relatively slow access speed. When a program is to be executed, the computer system uses a technique known as shadowing to copy the code and data required to execute the program from the slow nonvolatile memory to the faster volatile memory. The shadow copy in the main memory is then used to execute the program. If any changes are made to the shadow copy during the course of the program execution, the shadow copy can be copied back to the slower nonvolatile memory, when the program finishes execution. Furthermore, because an unexpected power failure will cause the contents of the volatile main memory to be lost, it is common to save intermediate results generated during the course of execution of the program.

The most common form of main memory is dynamic random access memory (DRAM). DRAM is more commonly used than SRAM, even though it is slower than SRAM because DRAM can hold approximately four times as much data as a SRAM of the same complexity.

DRAMs store information in integrated circuits that contain capacitors. Because capacitors lose their charge over time, DRAMs must be controlled by logic that causes the DRAM chips to continuously "refresh" (recharge). When a DRAM is being refreshed, it cannot be read from, or written to, by the microprocessor. Thus, if the microprocessor must access the DRAM while it is being refreshed, one or more wait states occur.

In some computer systems, SRAM is used as main memory in place of DRAM. One advantage of using SRAM as main memory is that SRAM is relatively faster to access than DRAM. Furthermore, because SRAM does not need to be refreshed, it is always available for access by the microprocessor, thereby eliminating the DRAM associated need for the microprocessor to include wait states when accesses are attempted while the DRAM is being refreshed. Moreover, the lack of a refresh requirement simplifies designing a computer system having SRAM based main memory because one does not have to worry about controlling refresh cycles. In fact, a simple battery back-up can be supplied to preserve the contents of the SRAM in the event of a power failure. Of course, if the battery back-up fails, the contents of the SRAM main memory will be lost.

Rather than building a main memory completely from SRAM, it is more common to implement the main memory using DRAM, and then to supplement the DRAM based main memory with a SRAM based external cache memory (i.e. a cache memory that is external to the microprocessor chip). Because the external cache is not contained on the microprocessor chip, it can typically be made to store more data and instructions than can be stored by the internal cache. Because the external cache is not located on the microprocessor chip, however, it must supply the data and instructions to the microprocessor using one of the buses that often form bottlenecks for data and instructions entering and leaving the microprocessor chip.

A high speed microprocessor chip typically interfaces with the rest of the computer system using one or two high speed buses. The first of these buses is a relatively high speed asynchronous bus called a main memory bus. The second of these buses is a relatively high speed synchronous bus called a local bus. The typical operating speed of main memory and local buses is in the range of 16 to 33 MHz and the trend is towards increasingly faster buses.

Although most microprocessors can interface directly with a main memory bus, some microprocessors do not provide an external interface to a local bus. These microprocessors typically interface with a relatively slow speed synchronous bus called an expansion bus. The typical operating speed of an expansion bus is in the range of 8 to 12 MHz.

The main memory (or DRAM) bus is used by the microprocessor chip to access main memory. Usually, rather than interfacing directly to the DRAM chips, the microprocessor is coupled to a DRAM controller chip that, in turn, is coupled to the DRAM chip or chips. The DRAM controller controls accesses to the DRAM chips initiated by the microprocessor. The DRAM controller also controls overhead maintenance such as the refresh cycles for periodically refreshing the DRAM contents. Some microprocessors have the DRAM controller built directly into them. Frequently, the DRAM or SRAM chips are contained in surface-mount packages and several DRAMs or SRAMs are attached to a small circuit board to form what is called a Single In-line Memory Module (SIMM). One can then relatively easily modify the total amount (or the access speed) of main memory in a computer system by simply swapping one type of SIMM for another. A SRAM based external cache may also be coupled to the microprocessor through the DRAM bus.

If a computer system has a local bus, then the microprocessor can access devices coupled to the local bus at a relatively fast speed. Thus, high bandwidth devices such as graphics adapter cards and fast input/output devices are typically coupled directly to the local bus. Sometimes the external cache is coupled to the local bus rather than to the DRAM bus. It is also possible to supplement (or replace) the main memory on the main memory bus by coupling DRAM to the local bus using a DRAM controller designed to interface with the local bus.

Each device coupled to the local bus has an associated capacitive load. As the load on the local bus is increased, the maximum operating speed for the local bus decreases and the power required to drive the bus increases. Therefore, one device coupled to the local bus can be a peripheral bus bridge from the local bus to another bus called a high speed peripheral bus (e.g. a peripheral component interconnect (PCI) bus). The bus bridge isolates the load of the devices coupled to the high speed peripheral bus from the high speed local bus.

Another device coupled to the local bus is typically an expansion bus bridge that couples the high performance local bus to a lower performance expansion bus. The low bandwidth components of the computer system are then coupled to the lower performance expansion bus. One type of device that is typically coupled to the expansion bus uses flash memory. Flash memory typically is a high-density, nonvolatile, read-write memory. Examples of flash memory based devices include BIOS ROM and hard disk substitutes.

Flash memories differ from conventional EEPROMs (electrically erasable programmnable read only memories) with respect to erasure. Conventional EEPROMs use a select transistor for individual byte erase control. Flash memories, on the other hand, achieve much higher density with single transistor cells. For a typical flash memory array, a logical "one" means that few if any electrons are stored on a floating gate associated with a bit cell. A logical "zero" means that many electrons are stored on the floating gate associated with the bit cell. Each bit of the flash memory array cannot be overwritten from a logical zero state to a logical one state without a prior erasure. During a flash erase operation, a high voltage is supplied to the sources of every memory cell in a block or in the entire chip simultaneously. This results in a full array or a full block erasure.

After a flash memory array has been erased, a logical one is stored in each bit cell of the flash memory array. Each single bit cell of the flash memory array can then be programmed (overwritten) from a logical one to a logical zero, given that this entails simply adding electrons to a floating gate that contains the intrinsic number of electrons associated with the erased state. Program operations for flash memories are also referred to as write operations.

The read operation associated with a typical flash memory array closely resembles the read operation associated with other read-only memory devices. A read operation for a typical high speed flash memory array takes on the order of 80 nanoseconds (nS). Write and erase operations for a flash memory array are, however, significantly slower. Typically, an erase operation takes on the order of one second. A write operation for a single word of a flash memory array takes on the order of 10 microseconds.

British patent document no. GB 2 251 324 A, published Jul. 1, 1992, describes a computer system that uses flash memory. The patent document discloses various architectures to incorporate a flash memory into a computer system. One architecture referred to therein is a variable file structure. For the variable file structure, computer code is stored contiguously in flash memory, allowing a CPU to execute computer code directly from the flash memory array without the need for RAM. A direct mapped variable file structure is described that allows direct code execution from all of the flash memory array. A page mapped variable file structure is also described that allows direct code execution from a portion of the flash memory array. Thus, flash memory can serve as the main memory within portable computers, providing user functions similar to those of disk-based systems.

A ROM-executable DOS is available commercially and provides several benefits to both system manufacturers and ultimately end users. First, because most of the operating system is composed of fixed code, the amount of system RAM required to execute DOS is reduced from 50K to 15K, thereby conserving system space and power. Secondly, DOS can now be permanently stored in, and executed from, a single ROM-type of device such as flash memory. This enables systems to be provided that are ready to run right out of the box. Lastly, users enjoy "instant on" performance because the traditional disk-to-DRAM boot function and software downloading steps are eliminated.

For example, by storing application software and operating system code in a Resident Flash Array (RFA), users enjoy virtually instant-on performance and in-place code execution. An RFA also protects against software obsolescence because, unlike ROM, it is in-system updatable. Resident software, stored in flash rather than disk, extends battery life and increases system reliability.

Because erasing and writing data to flash memory is a distinctly different operation than rewriting the information to a disk, new software techniques have been developed to allow flash to emulate disk functionality. File management software allows Flash Memory components and flash cards to emulate the file storage capabilities of disk. For example, Microsoft's Flash File System (FFS) (available from Microsoft Corporation of Redmond, Washington) transparently handles data swaps between flash blocks similar to the way MS-DOS handles swaps between disk sectors. Under FFS, the user can input a MS-DOS or Windows command without regard for whether a flash memory or magnetic disk is installed in the system. Flash filing systems make the management of flash memory devices completely transparent to the user. Flash filing systems similar to the Microsoft FFS are available or are being developed for other operating systems besides DOS and Windows.

Flash Memory is exceptionally well-suited to serve as a solid-state disk or a cost-effective and highly reliable replacement for DRAMs and battery-backed static RAMs. Its inherent advantages over these technologies make it particularly useful in portable systems that require the utmost in low power, compact size, and ruggedness while maintaining high performance and full functionality.

Flash memory, however, typically has an asynchronous interface wherein an address to be read is specified and then, a set time later, the contents stored at the specified address are output from the flash chip. It is only after the data has been output from the flash chip that the next address to be read can be sent to the flash chip. A high speed bus like the local bus can run at 33 MHz wherein every cycle of the bus takes about 30 nS. A typical high performance flash chip, on the other hand, has a read access time of about 80 nS. Hence, if flash is to be used as main memory, every single memory access to flash involves wait states and zero wait state back to back burst read cycles from flash cannot be supported. This is true for other devices having a read latency similar to that of flash memory. Thus, using prior art technology, it is not practical to use these memories as main memory for a high speed microprocessor.

SUMMARY AND OBJECTS OF THE INVENTION

Therefore, one object of the present invention is to provide an efficient memory hierarchy based on non-volatile memory versus volatile memory wherein both data and applications are stored in random access nonvolatile memory and further wherein applications are executed directly from the random access non-volatile memory.

It is also an object of this invention to enable flash memory to operate in an optimal synchronous fashion with any synchronous bus.

It is also an object of this invention to enable flash memory to operate in an optimal synchronous fashion with any synchronous bus to provide a low cost, low power alternative to volatile main memory, and to eliminate the time required to transfer code and data from the hard disk to the main memory.

It is also an object of this invention to enable flash memory to operate in an optimal synchronous fashion with any synchronous bus so that the CPU can execute programs directly out of the flash memory without any degradation in performance when compared to volatile memory based main memory.

It is also an object of this invention to enable flash memory to operate in an optimal synchronous fashion with any synchronous bus and to thereby eliminate the need to incorporate costly memory subsystem designs such as interleaving into the system.

It is also an object of this invention to enable flash memory to operate in an optimal synchronous fashion with any synchronous bus and to thereby support back to back burst cycles and thus ensure that cache line fills are performed in a quick and optimal fashion.

It is also an object of this invention to enable flash memory to operate in an optimal asynchronous fashion with any asynchronous main memory bus.

It is also an object of this invention to enable flash memory to operate in an optimal asynchronous fashion with any asynchronous main memory bus to provide a low cost, low power alternative to volatile memory based main memory and to also eliminate the time required to transfer code and data from the hard disk to the main memory.

It is also an object of this invention to enable flash memory to operate in an optimal asynchronous fashion with any asynchronous main memory bus such that the CPU can execute programs directly out of the flash memory without any degradation in performance when compared to volatile memory.

It is also an object of this invention to enable flash memory to operate in an optimal asynchronous fashion with any asynchronous main memory bus and to eliminate the need to have custom controllers.

It is also an object of this invention to enable flash memory to operate in an optimal asynchronous fashion with any asynchronous main memory bus to provide a glueless interface to the existing main memory controller and thus reduces cost and loading on the local bus.

A flash memory chip that can be switched into four different read modes is described. Computer systems and hierarchies that exploit these modes are also described. In the first read mode, asynchronous flash mode, the flash memory is read as a standard flash memory. In this mode, the reading of the contents of a first address must be completed before a second address to be read can be specified.

In the second read mode, synchronous flash mode, a clock signal is provided to the flash chip and a series of addresses belonging to a data burst are specified, one address per clock tick. Then, the contents stored at the addresses specified for the burst are output sequentially during subsequent clock ticks in the order in which the addresses were provided. Alternately, if a single address is provided to the flash chip when it is in the synchronous mode, the subsequent addresses for the burst will be generated within the flash chip and the data burst will then be provided as output from the flash chip.

In the third read mode, asynchronous DRAM (dynamic random access memory) mode, the flash memory emulates DRAM. Thus, row and column addresses are strobed into the flash memory using row and column address strobe signals. The flash memory then converts the row and column addresses internally into a single address and provides as output the data stored at that single address. Furthermore, although the flash memory does not need an extended precharge period or to be refreshed, when in the asynchronous DRAM mode, the flash memory responds to precharge periods and refresh cycles as would a DRAM. Therefore, when in the asynchronous DRAM mode, the flash memory can be controlled by a standard DRAM controller.

In the fourth read mode, synchronous DRAM mode, the features of the second and third modes are combined to yield a flash memory that emulates a synchronous DRAM. Thus, addresses to be read as a data burst are specified by strobing row and column addresses into the flash memory using RAS and CAS signals. The data of the data burst is then provided sequentially as output from the flash memory on subsequent clock ticks.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
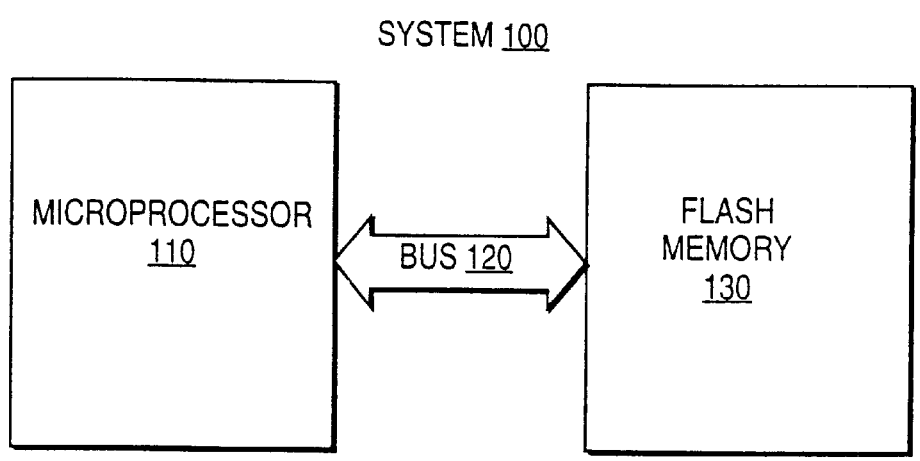
FIG. 1 illustrates a computer system having a microprocessor that is coupled to a flash main memory by a high speed bus.

FIG. 1 illustrates a computer system 100 wherein microprocessor 110 is coupled to flash memory 130 by high speed bus 120. In computer system 100, flash memory 130 is used to replace some, if not all, of volatile main memory (not shown). Thus, flash memory 130 is used in lieu of volatile main memory such as dynamic random access memory (DRAM) or static random access memory (SRAM) to provide a high speed non-volatile main memory for computer system 100.

A computer hierarchy based upon volatile main memory loses all information in main memory when power is turned off. A flash-based non-volatile main memory, however, reduces or eliminates the lengthy process of obtaining information from disk when power is turned on. Therefore flash main memory based computer system 100 has higher system performance when a program is initially executed than would a volatile main memory based computer system.

Furthermore, by using flash memory as a main store, the duplication of shadowing information on both disk and RAM is no longer necessary thereby reducing memory cost by eliminating memory duplication.

Moreover, by having information stored in non-volatile flash memory, power consumption is reduced because battery backup of volatile memory is eliminated and because disk accesses are minimized or eliminated.

Figure 2:
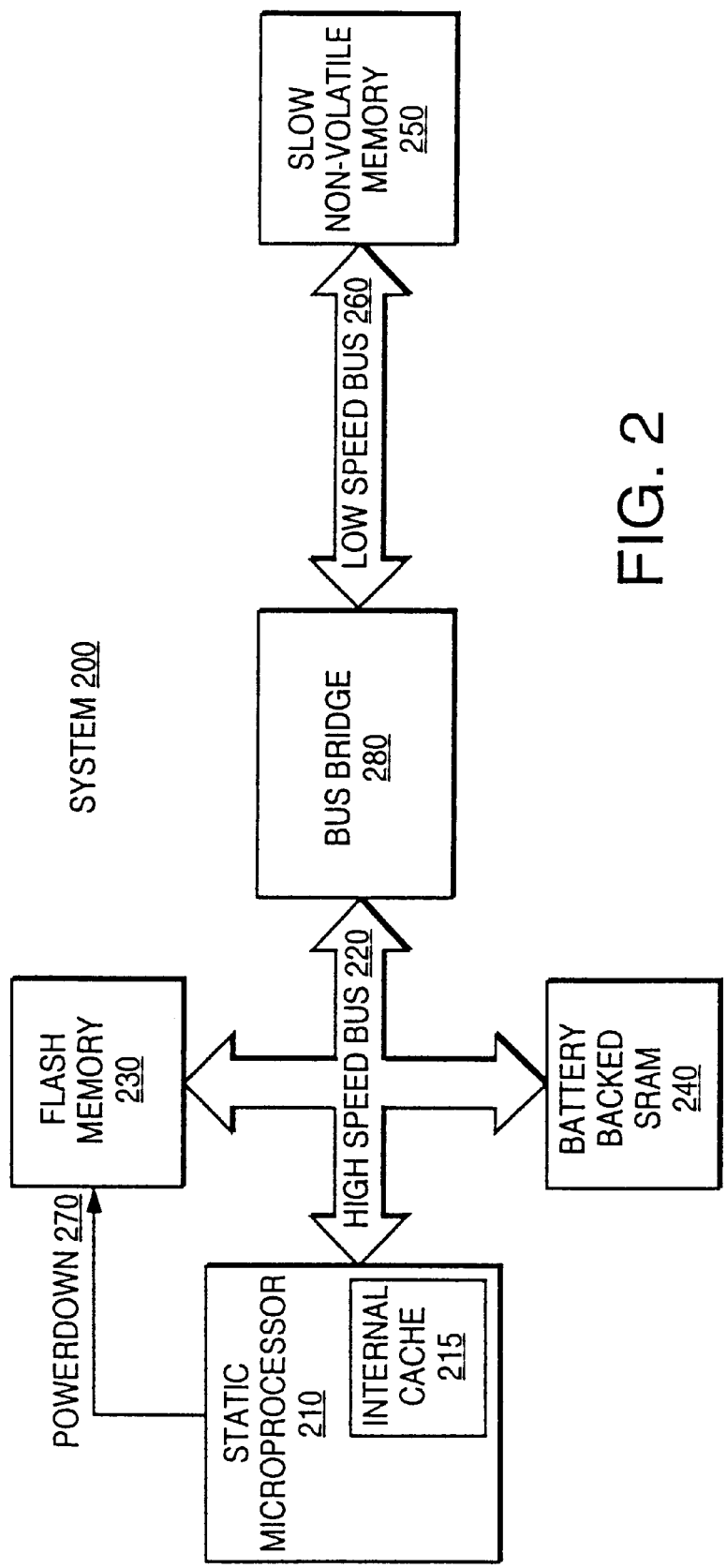
FIG. 2 illustrates computer system that combines a static microprocessor with a flash main memory to form a low power consumption, but high performance, computer system.

FIG. 2 illustrates a computer system 200 wherein static microprocessor 210 is coupled to flash main memory 230 and battery-backed SRAM 240 by high speed bus 220. Bus bridge 280 couples high speed bus 220 to low speed bus 260. Slow non-volatile memory 250 is coupled to low speed bus 260.

In a typical modern volatile main memory based computer system, there will be four to eight megabytes of volatile main memory, of which, approximately half will be used to store an operating system, executable code for applications and non-changing data files. The rest of the main memory typically contains data files (and executable code for infrequently used applications) that are read from and written to frequently. The former type of information is stored in what is commonly referred to as "read mostly" files and the latter type of information is stored in what is commonly referred to as "read/write" files. In computer system 200, flash memory 230 is used to store the read mostly files and SRAM 240 is used to store the read/write files that are currently in use.

The benefits obtainable by using a computer system having a flash memory based main memory architecture of system 200 is best illustrated by example. Suppose that a user had a computer and frequently used the computer in a windows operating system environment to run a word processor application (to write letters). Further suppose that the user occasionally used the computer to play video games.

Because most computer operating systems (and applications) are designed to be executed from random access memory (i.e. memory that can be read from and written to), no effort is made to divide their memory address space into read only and read/write areas. In actuality, very little of the memory address space will be written to. Most of the memory address space will be read from to provide code instructions and data that infrequently changes.

ROM-able programs are written to provide code that can be executed from read-only memory (ROM). In ROM-able programs, the code is carefully written to ensure that most of the memory address space is read-only. If there are any parts of the program memory address space that must be written to, these parts are contained in a separate read/write memory address space (that can be saved to a read/write memory device). ROM-able versions of Windows, the underlying Disk Operating System (DOS), and popular applications such as word processing programs are currently commercially available.

Thus, the user of computer system 200 can benefit by storing the read-only parts of ROM-able DOS, ROM-able Windows and a ROM-able word processing program in flash memory 230. The read/write parts of these programs and the rest of the applications and files can be stored in slow non-volatile memory 250.

Then, when the user starts computer system 200 to write a letter, the read-only parts of the DOS, Windows and the word processor will be resident in flash memory 230. If these programs need any read/write files (e.g. system configuration information), these (typically small) files will quickly be loaded from slow non-volatile memory 250 to battery backed SRAM 240 over bus bridge 280 and low speed bus 260. In short, the major parts of the DOS, Windows and word processing programs will be resident in non-volatile flash memory 230 and can be executed in place directly from non-volatile main memory 230 as soon as the system powers up. Therefore, it will appear to the user as though computer system 200 starts up instantly with the word processor loaded and ready to write the letter.

The user can then retrieve into SRAM 240 a file containing a previously written letter to modify (from where it was stored in slow non-volatile memory 250). Alternately, the user can open a new file in the memory address space of SRAM 240 and can use the new file to start an entirely new letter.

After working on the letter for a while, suppose the user decides to play one of the computer games stored in slow non-volatile memory 250. In such a case, the program associated with the selected game will be loaded into SRAM 240 and the game will begin.

If the user wishes to take a break, the user can suspend the game and leave computer system 200 running. While the user is gone, static microprocessor 210 will sense user inactivity and send a powerdown signal to flash memory 230 over powerdown signal line 270. Then static microprocessor 210 and flash memory 230 will enter a state of low power consumption.

Flash memory 230 and slow non-volatile memory 250 are both non-volatile. Additionally, flash memory 230 will draw little power when in its energy saving powerdown mode and non-volatile memory 250 will not have to be accessed while the user is away. Furthermore, because microprocessor 210 is a static microprocessor, it will draw very little power but will retain its state when it enters its deep powerdown mode. Moreover, the read/write files (including the executable code for the game) stored in battery backed SRAM 240 will not be lost.

Later, when the user returns, the game can be continued almost instantly from the place where it was suspended. This is because, even though very little power will be consumed while the user is away, the state of computer system 200 will be retained.

Furthermore, if the user desires to upgrade the DOS or Windows operating systems or to upgrade the program stored in flash main memory 230, this will be easy to do because of the ability to write to flash memory. The erasing and then programming operations required to write to flash memory will mean that it will take longer to store programs in flash memory 230 than would be the case where the main memory was volatile memory such as DRAM. Installation of a program, however, is performed infrequently and is usually a relatively prolonged process anyway. Therefore, the extra time required to install a program into non-volatile flash main memory 230 will usually be insignificant when compared to the benefit of having the program instantly available for execution from non-volatile flash memory 230 whenever system 200 is started.

The ability to write to flash main memory 230 further means that the user can install a different program in place of (or in addition to) the word processing program currently stored in flash main memory 230. Therefore, the user can switch to a rival word processing program by installing the rival word processing program in flash main memory 230. Alternately, the user can, for example, install a spreadsheet or graphics design program in flash memory 230 in place of the word processing program that is currently stored there.

Moreover, provided there is sufficient room in the flash memory 230, the user can install additional applications there. Thus, for example, if the user has a particular computer game that is the current favorite, it can be installed to reside in the flash memory 230.

Note that a program can be installed in flash memory 230, even if the program is not ROM-able. As described previously, because flash memory can be written to, a flash file system will permit standard applications to execute in place from flash memory 230. The asymmetric read/write nature of flash will, however, cause a performance penalty to be incurred when standard (i.e. non-ROM-able) programs are executed in place from flash main memory 230.

There are approaches that can be used, however, to mitigate these performance problems. One approach is for the operating system to mark the memory address space of the application as being read-only while the application is executing. Then, if the application attempts to write to flash main memory 230, an interrupt will occur and an error handler can cause the write to be redirected to SRAM memory 240. Later, when there is a lull in processing, the information can be written from SRAM 240 to flash 230 as a background operation. In effect, a portion of SRAM 230 can be used as a write cache for flash main memory 240.

One benefit of using a portion of SRAM 240 as a write cache is that applications stored in flash 230 do not need to be ROM-able. Another benefit is that the write areas of the application memory address space will probably be relatively well localized. In the fortunate case where this is so, any subsequent read or write operations to the write cache will benefit from the faster access of SRAM 240. Also, because it is frequently the case that the information to be written back to the application memory space is ephemeral (i.e. not to be saved from one execution of the application to the next), any ephemeral information in the write cache when the application terminates will not have to be written back to the flash memory 230.

From the above example, one can see that, when compared to a computer system that has the traditional volatile main memory based architecture, there are many beneficial and synergistic effects that stem from having the non-volatile main memory computer system architecture of computer system 200.

First, computer 200 can start instantly when power is first applied. Thus, there is no need to spend time and power loading the operating system and frequently used applications such as the word processor into main memory; they are already there and virtually instantly available.

Second, there is no need to store a copy of an operating system (e.g. DOS and Windows) or to store frequently used application programs (e.g. the word processing program) on slow non-volatile memory 250. Thus, slow non-volatile memory 250 can be smaller than would be required if shadowing of these files was required.

Third, using techniques that will be described below in greater detail, unlike asynchronous (volatile) DRAM, a burst read can be made to flash memory 230. Thus, a cache line for internal cache 215 of microprocessor 210 can be filled from flash memory 230 faster than would be the case if asynchronous DRAM based main memory was used.

Fourth, SRAM 240 can be written to, and read from, faster than can volatile DRAM. Thus, a cache line of internal cache 215 of microprocessor 210 can be filled from SRAM 240 faster than would be the case if a DRAM based main memory was used. Also, programs executing from SRAM 240 can be accessed, and hence executed, faster than would be the case if a DRAM based memory was used.

Fifth, a portion of SRAM 240 can be used to provide an external cache for flash memory 230 thereby further enhancing the execution speed.

Sixth, a lower performance microprocessor can be used to provide the same level of performance as would be the case if a DRAM based main memory was used. This is because the low bandwidth constraint of a volatile DRAM based main memory caused by the need to load the operating system and programs will be eliminated. The operating system and programs are instead stored in non-volatile flash main memory 230. This is also because in system 200 there will be a better match between the data and program instruction needs of microprocessor 210 and the ability of the flash 230/SRAM 240 based main memory to supply them than would be the case with a DRAM main memory system. This will result in fewer idle wait states for microprocessor 210. Frequently, microprocessor 210 will be able to operate with zero wait states. Therefore, even though there will be fewer cycles in which microprocessor 210 can do work because it is a lower performance microprocessor, fewer of the cycles that are available to the microprocessor will be wasted while the microprocessor is waiting for code or data.

Seventh, because microprocessor 210 can have a lower clock rate for a given level of performance, microprocessor 210 will be less expensive, have fewer heat dissipation problems and use less power than if a DRAM based main memory that required that a faster processor to be used.

Eighth, because microprocessor 210 and flash 230 can enter a deep powerdown mode until they are needed, further energy savings will result.

Thus, a non-volatile read/write general purpose computer hierarchy can be achieved with the architecture described above when the dominant portion of main (execute) memory is flash memory.

Depending upon the requirements of system 200, archival storage (i.e. slow nonvolatile memory 250) may or may not be present in the system. If it is present, the needs of system 200 can govern the technology used to provide it (i.e. mechanical, optical or solid state). Also, depending upon the particular needs of the system 200, battery-backed SRAM 240 can alternately be replaced by non-volatile RAM (NVRAM), electrically erasable programmable ROM (EEPROM), DRAM, SRAM, or battery-backed DRAM.

The underlying theme of each of the above configurations for system 200 is that the CPU of microprocessor 210 is fetching code and/or data from random access non-volatile (flash) memory 230 and writing back different data and/or programs on an as-needed basis. As described previously, the new information may or may not be written to the same place in main memory. A RAM based system is inherently volatile. A ROM based main memory system, although non-volatile, does not provide the capability to write back to the ROM.

Flash is not a symmetrical technology as is the DRAM., i.e. it does not allow for byte alterability at read speeds. Therefore, to modify a file or program in one embodiment, the portion to be altered is moved into byte alterable memory (e.g. NVRAM, EEPROM, SRAM or DRAM), modified, and then written back to flash main memory. This alterable memory can be separate memory chips and/or integrated onto a CPU or microprocessor. Data that is not being altered is read directly by the CPU from Flash. This configuration essentially eliminates disk down load for both read and unaltered data to provide faster read performance than a disk based system. For writes, the write back is comparable in performance to disk. Because the read cycle is faster, however, a higher overall system performance is provided.

The key to each of these configurations is that a flash memory is used as a main memory and is read at a speed that approximates, or surpasses, the read access speed of DRAM. There are basically four possible ways that this can be accomplished. The first way is to provide a hardware controller that interleaves read operations to more than one conventional asynchronous flash main memory chip.

Multiple Chip Interleave for Asynchronous Flash Main Memory

Figure 3:
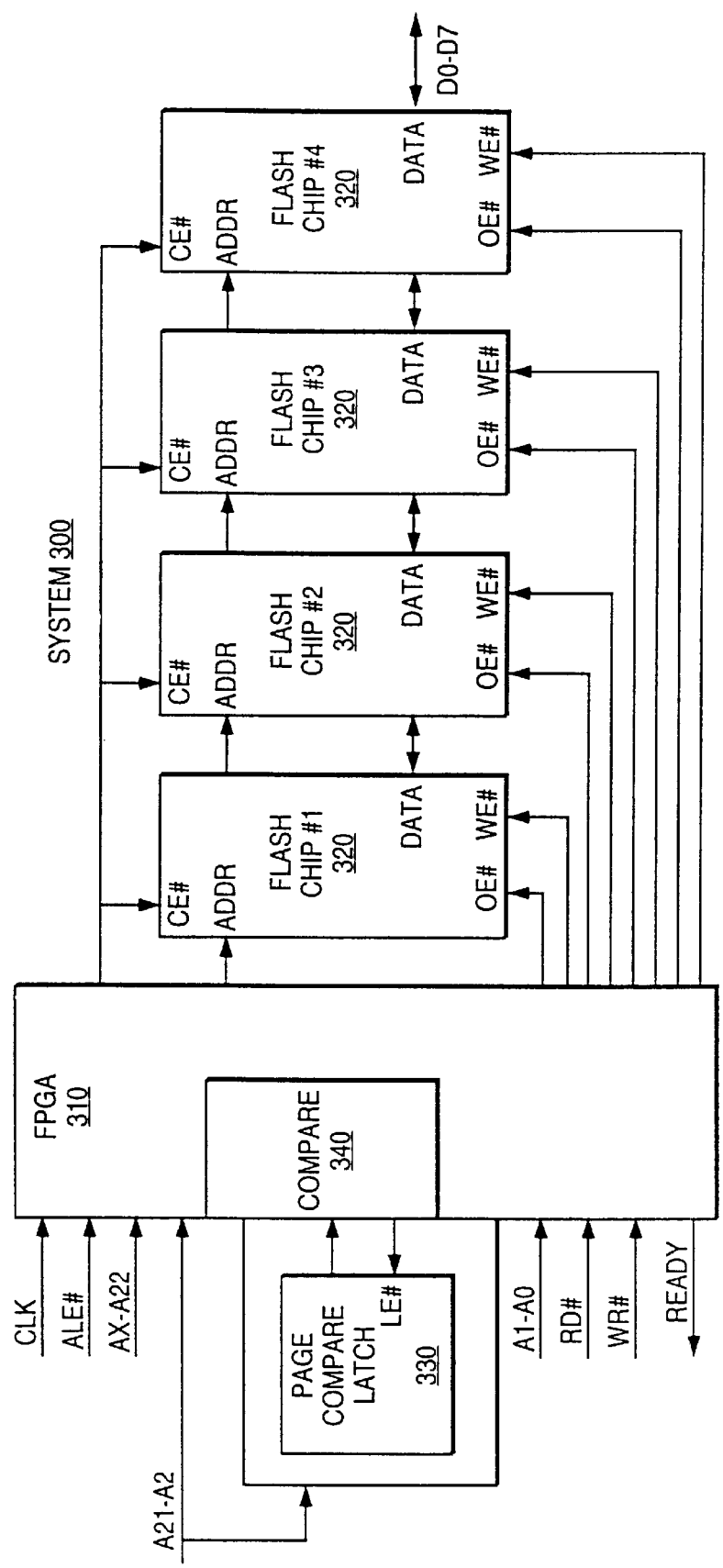
FIG. 3 illustrates a flash memory subsystem that interlaces several asynchronous flash memory units to support synchronous back to back data burst read cycles.

FIG. 3 illustrates a flash memory sub-system wherein four flash memory integrated circuits 320 (#1 through 4) are interlaced under the control of a controller unit to provide a burst read capability. Although FIG. 3 shows four flash integrated circuits 320, it is to be understood that if the data width of each individual integrated circuit 320 is not that of a double-word, an appropriate number of flash integrated circuits 320 would be provided in parallel with each of the circuits 320 of the figure to provide a double word data width. In this example, the controller is implemented using fully programmable gate array (FPGA) 310. In alternate embodiments, the interlace control is provided using alternate technologies.

Figure 4:
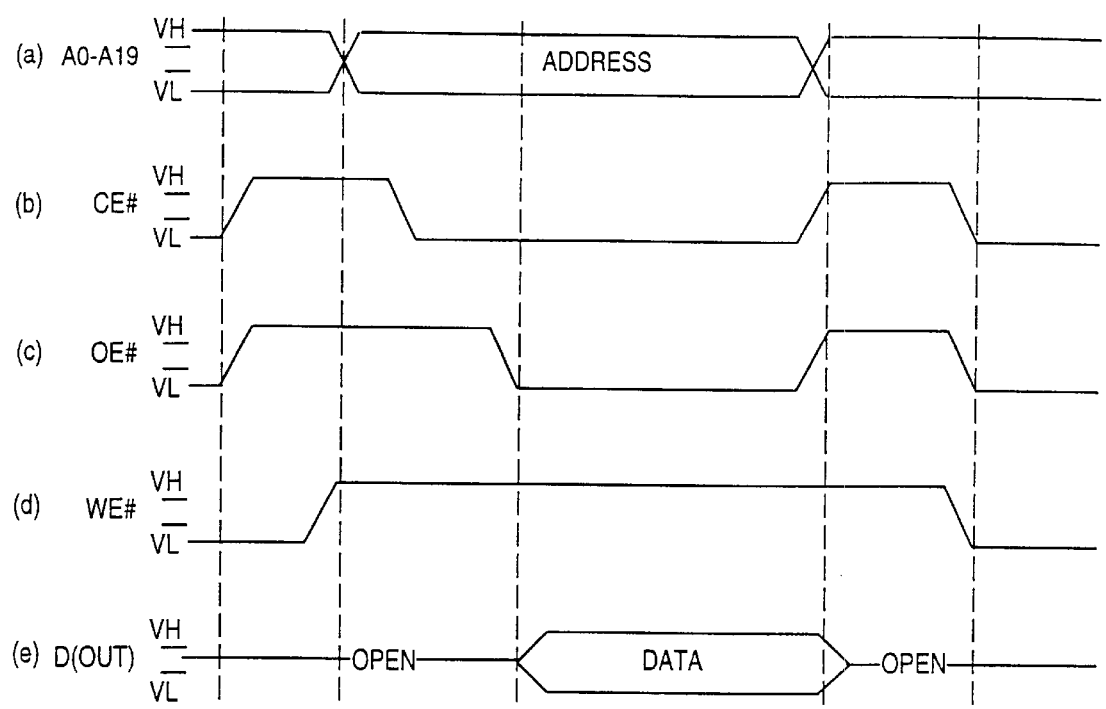
FIG. 4 is a timing diagram that illustrates a read cycle for an asynchronous flash memory.

FIG. 4 illustrates the read cycle for a typical asynchronous flash memory such as flash memory integrated circuits 320 of FIG. 3. From FIG. 4 it can be seen that before and after a read cycle the data lines ($D_{OUT}$) of the flash memory are tri-stated (indicated in the figure as OPEN). This means that the data lines have been placed into a high impedance state.

The read cycle of FIG. 4 begins with the transition of output enable (OE#) and chip enable (CE#) signals from low voltage ($V_L$) to high ($V_H$). Next, if it is not already high, a write enable (WE#) signal is transitioned high to signify a read operation and the address to be read is placed on the address pins ($A_0$ through $A_{19}$) of the flash chip. The data stored at the address specified is then retrieved internally from the flash array. The read process takes a known amount of time that is constant. Once that amount of time has elapsed, the OE# signal is brought low and the data that was read from the specified address is driven by the flash chip out onto the data lines ($D_{OUT}$). The read cycle ends when the CE# and OE# signals are again brought high (perhaps to begin the next read cycle).

Note in FIG. 4 that a new address to be read cannot be specified until the previous read cycle has completed. Therefore, a single standard asynchronous flash memory unit cannot be interlaced to support rapid, back to back read cycles. One must instead wait for the first read cycle to complete before a next read cycle can be begun.

The total access time of a standard asynchronous flash component ($T_{ACC}$) can be divided into two parts. First, there is the time to decode addresses and chip enable, select the correct bits in the flash array to be read and then sense their stored data ($T_{ACC}-T_{OE}$). Second, there is the time required to drive this information onto the data bus through the output buffers ($T_{OE}$). Once a single address for a data burst read is known, the rest of the addresses of the data burst read are also known. Therefore, referring again to FIG. 3, interlacing exploits this property of a data burst to amortize the first access time ($T_{ACC}-T_{OE}$) across two or more flash chips to provide a burst that has an improved average read access time.

Consider the case of a 20 MHz synchronous local bus (i.e. each clock cycle takes approximately 50 nS). At that speed, a typical microprocessor will have a maximum burst read capability of 2-1-1-1 bursts. That means that when the microprocessor reads a burst of data, the burst will be made of four double-words of data that are each part of the same cache line. Furthermore, once the microprocessor specifies the first address of the burst, it will be unable to accept the contents stored at that address for two cycles (approximately 100 nS in this example). Then, the microprocessor will be able to accept the respective contents of the second, third and fourth addresses of the cache line during the next three clock cycles.

If flash memory chips 320 each have a ($T_{ACC}-T_{OE}$) less than 2 clock cycles (approximately 85 nS) and a ($T_{OE}$) less than 40 nS, then flash memory sub-system 300 will be able to provide a burst read that matches the maximum burst read attainable by the microprocessor. This is because, as soon as FPGA 310 receives the first address of the data burst to be read, it will enable all four flash memory chips 320 and order each chip 320 to read one of the addresses of the data burst in parallel with the other chips 320. After the first two cycles, the data stored at the first address of the data burst will be available from flash 320 #1 Then, on each successive cycle thereafter, the data stored at the next address of the data burst will be available (from flash 320 #2, then #3 and finally #4).

This means that in this example flash memory sub-system 300 will be able to provide a data read burst of four double-words of data during a five clock cycle period (approximately 250 nS) thereby providing an average read time of approximately 50 nS. If interleaving were not used (e.g. if only one flash memory chip 320 was used), the read for each address would take three cycles, (i.e. two cycles for ($T_{ACC}-T_{OE}$) and one for ($T_{OE}$)) and each read would have to wait for any earlier read to complete. Using the numbers presented above, each address of the data "burst" to a single asynchronous flash 320 would take 150 nS. Therefore, without interlacing, the fastest burst speed attainable would be a 3-3-3-3 data burst that would take 600 nS to complete (4 times 150).

Clock signal CLK coordinates the operation of flash memory sub-system 300. In sub-system 300, four byte flash memory pages are selected by common addresses A21 through A2 of the AX through A0 memory space. The higher order addresses (AX through A22) decode the 4 Mbyte flash array in the system memory map. Addresses A1 and A0, along with the RD# (read) signal input to FPGA 310, cause FPGA 310 to generate output enable signals (OE#) for flash memory components 320 (#1 through #3). Therefore, in one embodiment, system addresses of flash sub-system 300 are associated with flash memory components 320 as follows:

| System Address | Component | Component Address |
| --- | --- | --- |
| 1 | #1 | 0 |
| 2 | #2 | 0 |
| 3 | #3 | 0 |
| 4 | #4 | 0 |
| 5 | #1 | 1 |
| etc... | #2 | 1 |

A data burst series of read accesses from memory sub-system 300 will proceed as follows:

First, the processor will signal that it is to read data from system address 0. Signal CE# will enable flash memories 320 #1 through #4 and signal ADDR will provide them with address 0. FPGA 310 will decode system address bits A1 and A0 and, because they are both zero, will enable the OE# signal for flash component 320 #1. Because this is the first access to the four byte page, the access will take 150 nS (i.e., three 50 nS clock cycles).

Second, the processor, executing sequential code, will read from system address 1. Components 320 #1 through # 4 will remain enabled, and address (ADDR) inputs to them will remain as zeros. FPGA 310 will then decode the "01" on system address bits A1 and A0, and enable the OE# line for component 320 #2. Because the data for component 320 #2 has already been selected and sensed, the access time for component 320 #2, therefore, will only have a 50 nS delay (i.e., one clock cycle).

Then, similar 50 nS accesses will follow for system addresses 2 and 3, reading from components #3 and #4, respectively.

If the next data burst begins with address 4, the processor will then read from system address 4 on its next cycle. This will change system address A2 from zero to one thereby incurring another full 150 nS delay for this access from component 320 #1. This is because a new 4-byte page, and therefore, new data from each of the flash memories 320 is to be read. Once again, however, subsequent accesses to system addresses 5, 6, and 7 will each only have a 50 nS duration.

FPGA 310 decodes lower addresses and, correspondingly, generates OE # signals to flash memory devices 320 within an interleaving page. The earlier example was for a four-byte page, so addresses A1 and A0 are decoded. For a two-byte page, only address A0 would be examined, whereas an eight-byte page would use addresses A2 through A0.

FPGA 310 will examine all upper address bits (i.e. AX to A22 in this example), to determine first if the memory subsystem 300 is being accessed, and then if access to the same page is occurring, and adjust wait states back to the processor accordingly (via the READY signal output). This function is accomplished by the comparison logic subblock 340 of FIG. 3.

Figure 5:
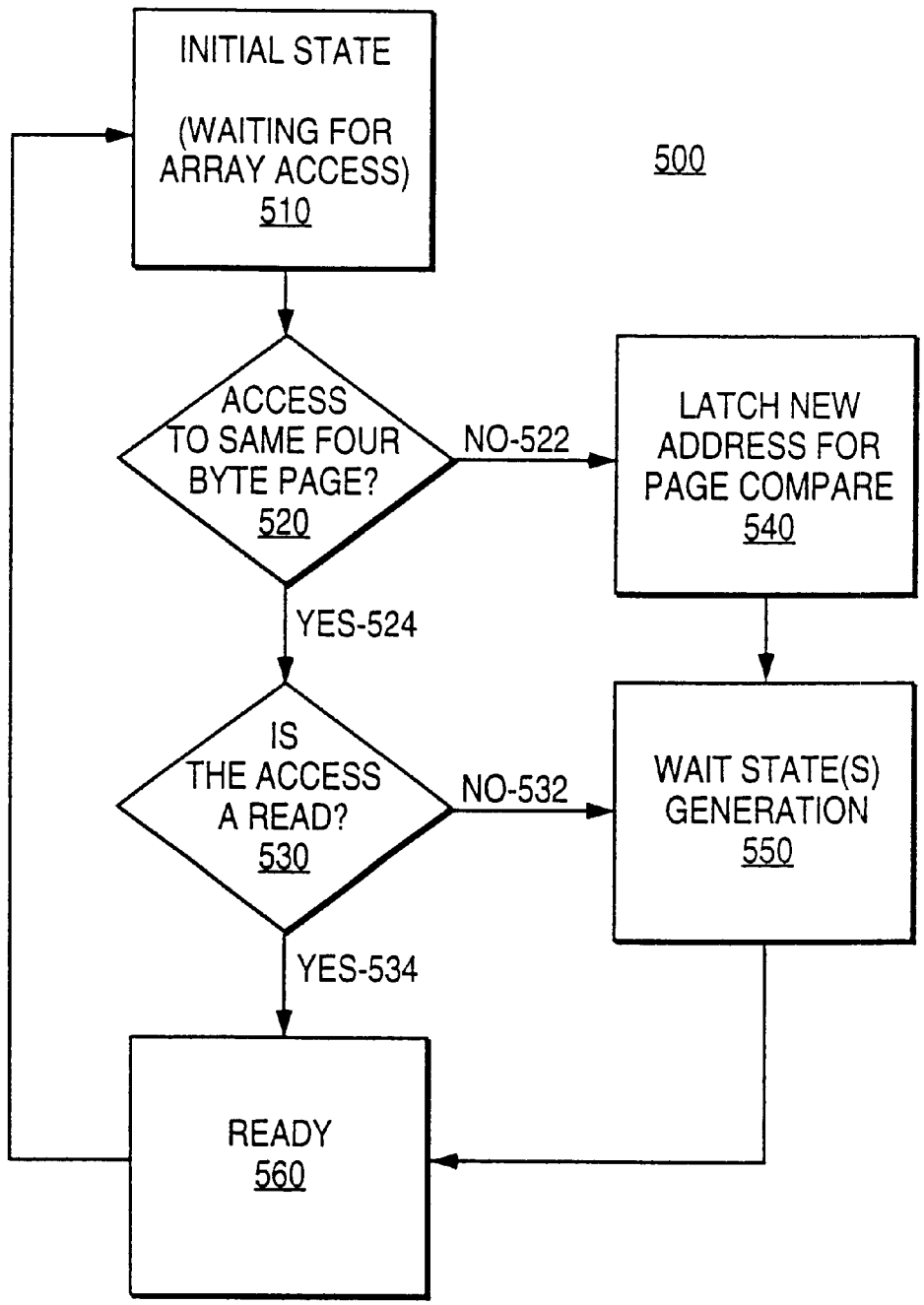
FIG. 5 illustrates a state transition diagram for the flash memory subsystem of FIG. 3.

Furthermore, FPGA 310 will distinguish between a read or write to flash memories 320, and adjust wait states accordingly. FIG. 5 illustrates a state transition diagram for hardware interleaving that is implemented in FPGA logic 310.

State transition diagram 500 begins in initial state 510 wherein the FPGA is waiting for an access to a flash memory 320 of subsystem 300. When the FPGA detects the beginning of an access to the flash memory 320 of sub-system 300, a test is made in state 520 to determine whether the access is to the same four-byte page as was the previous access. If the access is to the same four-byte page as was the previous access, then transition 524 is taken to state 530 and a test is made to determine whether the access is a read operation.

If it is determined in state 530 that the access is a read operation, then the information to be read is already available and a transition is made on path 534 to ready state 560 and the read is performed. After the read is performed, a transition is made from ready state 560 back to initial state 510 and the next access is awaited.

Returning now to state 530, if it is determined in state 530 that the access is not a read operation, then a transition is made on path 532 to wait state(s) generation state 550 and an appropriate number of wait states are performed while an erase is performed (if needed) and the information is programmed.

Returning now to state 520, if it is determined in state 520 that the access is not to the same four-byte page as the previous access, then a transition is made on path 522 to state 540 and a new address is latched for the page compare. Then, in state 550, an appropriate number of wait states are performed while the new four-byte page is accessed.

Note that the flash memory. writes cannot take advantage of interleaving as can reads because there are no $T_{ACC}$ or $T_{OE}$ equivalents for write operations. Although memory sub-system 300 supports back-to-back read bursts and reduces the average read access time for sequential accesses, it increases the complexity of the system hardware required over that required for access to a conventional asynchronous flash memory chip.

As described previously, however, a write cache or software interleaving techniques can be used to maximize program and erase performance of memory subsystem 300. Furthermore, in the case where a ROM-able program is being executed in place from flash memory sub-system 300, there will not be any writes to the flash memory during the execution of the program. In such a case, the slower write performance of the flash memory will only be a factor on the rare occasion that a new ROM-able version of the program is installed.

Synchronous Flash Interface (SFI) for Flash Main Memory

Besides requiring the additional system complexity of FPGA 310, a memory subsystem such as subsystem 300 will have to have at least two flash memory chips 320 to interleave between (four in the example of FIG. 3). Furthermore, if additional flash memory chips are to be added to sub-system 300, they too must (at least) be added in pairs. Moreover, each flash memory chip added to subsystem 300 is enabled simultaneously and, hence subsystem 300 consumes a large amount of power. Alternately, an entire synchronous flash interface can be incorporated onto a single flash memory chip.

Figure 6:
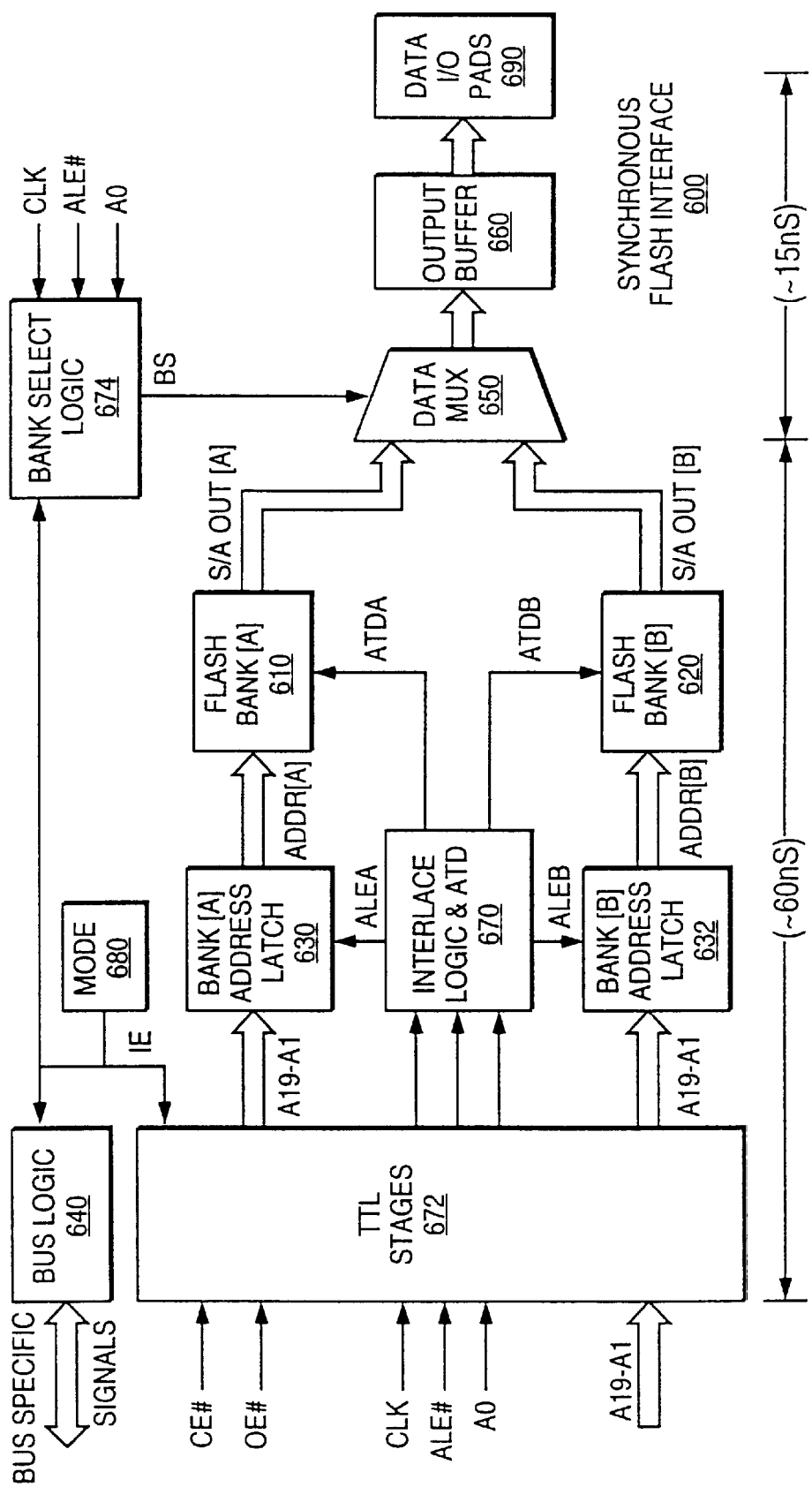
FIG. 6 illustrates a block diagram of a flash memory integrated circuit having a synchronous flash interface to support synchronous back to back data burst read cycles from internal banks of flash arrays.

FIG. 6 illustrates a block diagram of a synchronous flash interface (SFI) flash memory integrated circuit 600 that incorporates a complete synchronous flash interface in a single flash memory chip. The synchronous flash interface provides a means of converting the synchronous cycles that appear from a controller to the asynchronous protocol that the flash core understands. The device is internally split into two banks and the least significant address is used to distinguish between the two banks. In short the device is interleaved internally. The user can direct back to back cycles to the alternate banks and, after an initial delay equal to an asynchronous flash access time, data will output onto the output bus at a rate that is approximately equivalent to half the asynchronous flash access time. Hence, the device using this interface creates an average access time for sequential read accesses that is significantly less than the access time of an asynchronous flash device.

A clock input is a part of the interface. An address latch enable pin is present to indicate that a valid address is present on the address bus. All the external operations of the device are synchronized to the rising edge of the clock. ALE# is sampled on the rising edge of the clock and, if it is sampled valid, the address that is present on the address bus is latched into the part and an access commences. The user can alternately strobe addresses into the device every clock cycle. After an initial delay the data corresponding to these addresses is output on the data bus in synchronism with the rising edge of the clock. The user can cycle the device at frequencies as high as 33 MHz and can expect back to back burst cycles to be performed without any wait states in between. Also part of the design is a programmable latency that enables the user to define the clock cycle latency between address strobe and valid data.

In FIG. 6, the flash array of SFI 600 is divided into two banks, flash bank A 610, and flash bank B 620. Mode register 680 can be set to enable or disable the SFI mode. Thus, when mode register 680 is set, signal interlace enable (IE) enables interlace control logic and address transition detection (ATD) logic 670, transistor-to-transistor logic (TTL) stages 672, bank select logic 674 and bus logic 640. When SFI is enabled, interlace control 670 and bank select logic 674 operate to interlace read (and write) operations between flash bank A 610 and flash bank B 620 in a manner that is analogous to the way that FPGA 310 interlaced accesses to flash chips 320 in sub-memory system 300 of FIG. 3. Thus, a single SFI flash chip 600 can support back-to-back read bursts when mode register 680 has been set to SFI mode.

In the SFI mode, an address to be accessed is presented to TTL stages 672 on address buses A19 through A0 along with a clock pulse (CLK) and an address latch enable signal (ALE#). Output enable and write enable signals are also provided to TTL stages 672. Addresses A19 through A1 are then provided from TTL stages 672 to bank A address latch 630 and bank B address latch 632. Signals CLK, ALE# and A0 are provided to interlace control logic and ATD logic 670.

Based on the low order bit of the address (A0), interface control logic 670 controls bank A address latch 630 and bank B address latch 632 using signals address latch enable A (ALEA) and address latch enable B (ALEB), respectively. Thus, interface control logic 670 thereby steers the remaining higher order bits of the address to be accessed to flash bank A 610 or flash bank B 620. Signals address transition detected A (ATDA) and address transition detected B (ATDB) output from interlace control logic and address transition detection logic 670 prepare flash array banks A 610 and B 620, respectively, to be read.

Data multiplexer (MUX) 650 receives as input signal S/A OUT A from the sense amplifiers of flash bank A 610 when bank A 610 is read. Data MUX 650 also receives as input signal S/A OUT B from the sense amplifiers of flash bank B 620 when bank B is read. Bank select logic 674 receives signals CLK, ALE# and A0 as input and provides output signal bank select (BS). Signal BS is used to control data MUX 650 so that it interlaces the data read from banks A 610 and B 620 and steers the data into output buffer 660. Output buffer 660 then drives the data read out onto data input/output (I/O) pads 690 of SFI flash chip 600.

Thus, if a read access is being performed when SFI flash 600 is in the SFI mode, the next address to be accessed can be begun while the preceding access is being performed. If the next address to be read belongs to the bank that is not presently being read, then the next address can be steered to the appropriate bank (A 610 or B 620) while the output from the previous access is being latched into output buffer 660 and is being driven onto data I/O pads 690. Also part of the design is a programmable latency that enables the user to define the clock cycle latency between address strobe and the presentation of valid data on data I/O pads 690.

Alternately, more than two flash banks can be used in SFI chip 600 provided that an appropriate number of address bits are used to select the proper bank. Thus, if four banks are interlaced, two address bits would be used to select among the banks.

Figure 7:
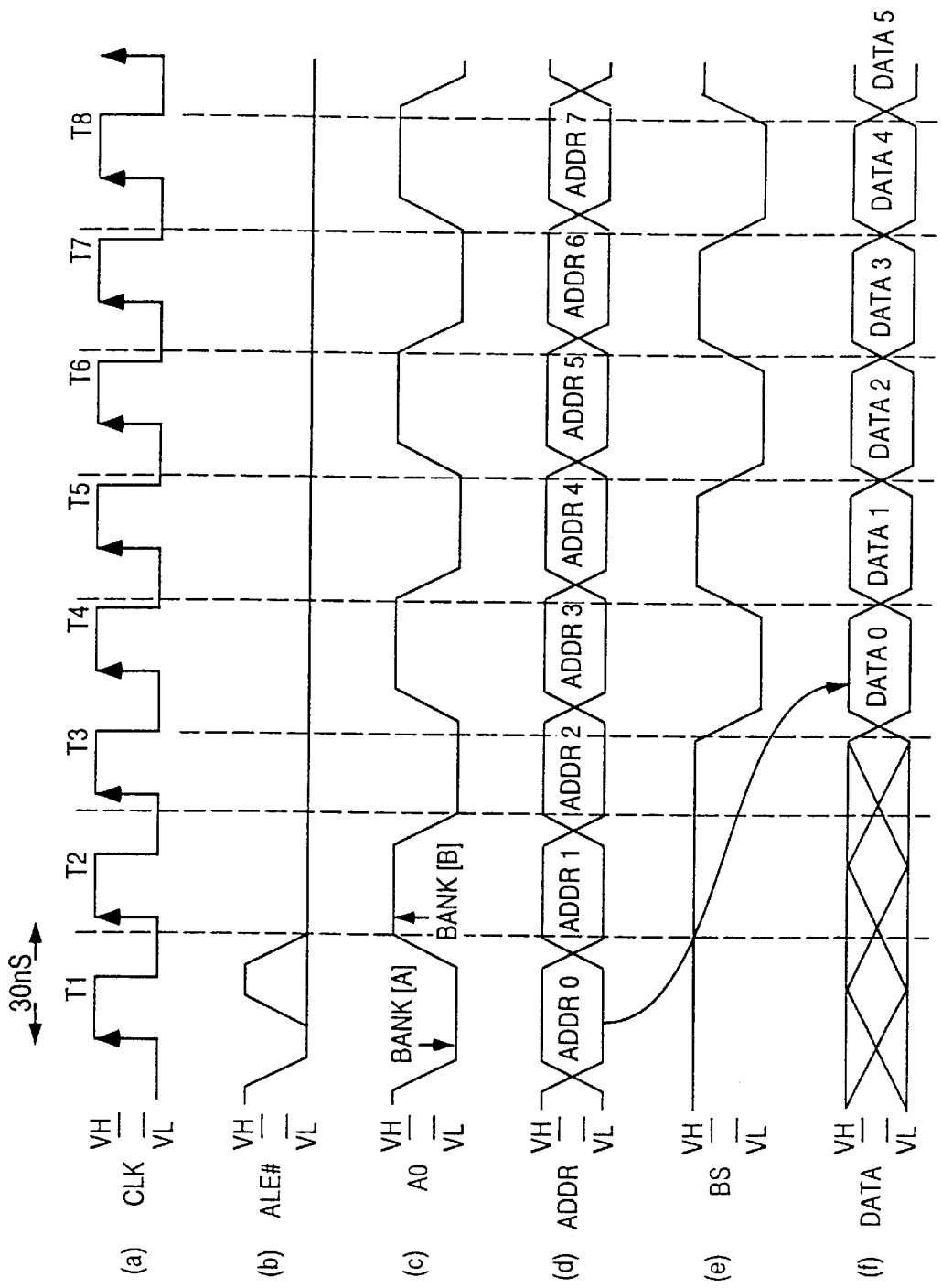
FIG. 7 is a timing diagram that illustrates a back to back data burst read cycle for the flash memory having the synchronous flash interface.

FIG. 7 is a timing diagram that illustrates a sustained read burst cycle for SFI flash 600 of FIG. 6. In FIG. 7, synchronizing clock signal CLK is operating at 33 MHz, therefore each pulse (T1 through T8) of signal CLK is 30 nS long. The read burst begins on the rising edge of clock pulse T1 when the first address to be read (ADDR 0) is placed on the address pins and address latch enable signal ALE# is brought low to indicate that a valid address is ready to be read. Note that the low order bit A0 of address ADDR 0 is low on the rising edge of clock pulse T1. Therefore, address ADDR 0 belongs to bank A and bank A will be read to retrieve the data stored at address ADDR 0.

The read burst continues on the rising edge of clock pulse T2 when the second address to be read (ADDR 1) is placed on the address pins. In one embodiment, address latch enable signal ALE# is brought high and then low to indicate that a valid address is ready to be read. Alternately, address latch enable signal ALE# is simply held low to indicate that another valid address is ready to be read. Note that the low order bit A0 of address ADDR 1 is high on the rising edge of clock pulse T2. Therefore, address ADDR 1 belongs to bank B and bank B will be read to retrieve the data stored at address ADDR 1. Because addresses ADDR 0 and ADDR 1 belong to different flash banks, both address locations can be read concurrently.

The read burst continues on the rising edge of clock pulse T3 when the third address to be read (ADDR 2) is placed on the address pins and address latch enable signal ALE# is held low to indicate that another valid address is ready to be read. Note that during period T3 the read from ADDR 0 of bank A (begun during period T1) completes. Thus, during period T3, bank select signal BS is brought low to steer the data read from ADDR 0 to the output buffer where it is latched. The data of ADDR 0 is then driven out onto the data I/O pads of the SFI chip at the beginning of pulse T4.

Meanwhile, because the low order bit A0 of address ADDR 2 is low on the rising edge of clock pulse T3, address ADDR 2 belongs to bank A and bank A will be read to retrieve the data stored at address ADDR 2. The bank A output from address ADDR 0 has been latched into the output buffer, so the reading of ADDR 2 of bank A can begin. Furthermore, addresses ADDR 2 and ADDR 1 belong to different banks, therefore both address locations can be read concurrently.

The burst read can continue indefinitely (or at least until the address space of SFI flash chip 600 is exhausted) with a new address being input on each clock pulse and the data for that address being output two pulses later.

Referring again to FIG. 6, in order for SFI chip 600 to be truly compatible with the high speed synchronous bus with which it communicating, bus logic block 640 receives and provides bus specific signals for SFI 600. Thus, the particular high speed synchronous bus may require, for example, that a parity bit be received with every write operation and then sent again as a handshake. In one embodiment, interface logic 640 will latch and examine all bits written to flash memory 600 during write operations and provide this parity data during the post-write "handshake". Alternately, by examining data during write attempts to flash memory 600, interface logic 640 can use the same parity algorithm used by the high speed synchronous bus to generate the required parity information for the post-write "hand-shake".

Furthermore, the bus protocol may be such that the parity bit may need to be sent from SFI 600 when data is read. Because flash memory does not require that parity bits be stored with data, bus logic 640 would use the same parity algorithm used by the high speed synchronous bus to generate the necessary parity bit when data is read. Thus, during flash memory 600 read operations, logic 640 will derive parity bits from the output of flash memory 600 for transfer to the high speed synchronous bus. Therefore, by examining data both during write attempts to flash memory 600 and read attempts from flash memory 600, interface logic 640 will generate the required parity information.

When mode register 680 is not set to indicate SFI mode, the synchronized bank interlacing control functionality of interlace control 670 is disabled and SFI flash chip 600 will function as would a standard asynchronous flash memory chip. In such a case, the CLK and ALE# signals will be ignored as will the bus specific input signals to bus logic 640. Instead signals CE# and OE# are used to access SFI flash 600 using an asynchronous read signal of the type depicted in FIG. 4.

In one embodiment, mode register 680 is implemented using content addressable memory. Alternately, in another embodiment there is no mode register 680 and the SFI functionality of chip 600 cannot be disabled and SFI chip 600 will not function as a standard asynchronous flash memory.

In one embodiment, the SFI flash memory 600 requires one address per word/byte read. Some burst processor buses, on the other hand, initiate a multiple-read burst access by providing a start address, and then repeatedly signaling for reads with no additional address information provided. Alternately, to accommodate these processors, SFI flash chip 600 will latch the start address of a burst, and using on-chip counters, will generate subsequent addresses throughout the remainder of the burst read sequence. In such a case, SFI chip 600 will contain a full-address latch, and a multi-bit counter that matches the addressable space in SFI flash memory array 600. After being provided the start address, the counter logic will auto-increment (in linear or non-linear order, depending on the bus) and feed addresses to the SFI flash memory banks. This allows a multiple-burst access of indeterminate length to occur at highest system performance.

Figure 8:
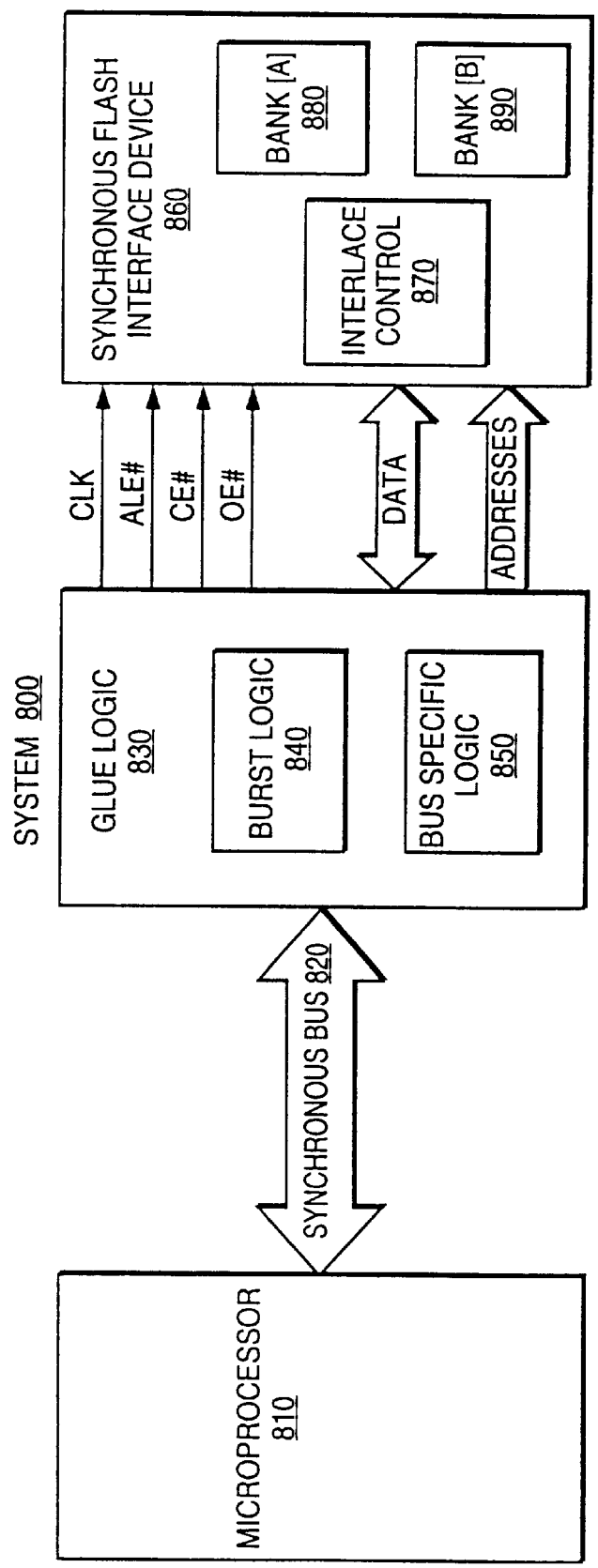
FIG. 8 is a block diagram of a computer system illustrating a generic synchronous flash interface flash memory unit coupled to a microprocessor using a high speed synchronous bus and bus specific glue logic.

FIG. 8 illustrates a computer system 800 that uses an alternate generic SFI chip approach. In FIG. 8, SFI flash chip 860 has a generic synchronous flash memory interface. Glue logic 830 is a separate integrated circuit chip that is placed between microprocessor 810 and SFI flash chip 860 to provide the circuitry required to interface SFI chip 860 to high speed synchronous bus 820.

One benefit of the approach of FIG. 8 is that providing a generic interface control 870 within SFI flash chip 860 permits a burst read of banks A 880 and B 890. Thus, rather than requiring pairs of asynchronous flash chips in order to perform interlacing, a flash main memory sub-system can be expanded in units of a single chip. At the same time, when compared to FPGA 310 of FIG. 3, the design of SFI glue logic 830 is simpler because glue logic 830 does not have to include the generic synchronous interface control logic 870 that would be required for any SFI chip 860.

Furthermore, a single SFI chip 860 can be used to interface with a large number of different synchronous buses because the bus specific control logic 850 is implemented within glue logic 830 instead of within SFI chip 860.

An additional benefit to this approach is that, when compared to a standard asynchronous flash chip, SFI chip 860 need only have two additional pins (i.e. CLK and ALE#). Any other signals that are required for synchronous bus 820 are provided by glue logic 830 in a manner that is transparent to SFI chip 860. Typically, a flash chip is mounted in a small package such as a thin small outline package (TSOP). Because of the small size of the package, a standard asynchronous flash chip will use almost all of the pins available to the package. When providing a generic synchronous flash interface, the two additional pins required are available even within constraints imposed by mounting the SFI flash chip 860 in a small package.

Note that glue logic 830 includes burst logic 840. This is because, as mentioned earlier, different microprocessors 810 use different burst ordering sequences.

A common sequence is the linear addressing sequence. In the linear addressing sequence, a data burst increments sequentially from the beginning address of the burst. Typically, in this sequence, the data burst will begin with the lowest address in the cache line being read and will increment through the addresses of the cache line.

The other burst sequence is a non-linear addressing sequence. In this sequence, the burst read does not necessarily have to begin with the lowest address of a cache line. If the burst does begin with the lowest address of the cache line, then the non-linear addressing sequence behaves as does the linear sequence. If, on the other hand, the burst begins on an address other than the lowest address of the cache line, the subsequent addresses of the burst are generated in a manner that guarantees that every address of the cache line will be accessed and that they will be accessed in a way that interleaves between odd and even address banks.

Burst logic 840 takes a first data address for a data burst and generates the rest of the addresses of the burst in accordance to whatever addressing sequence is required by microprocessor 810.

Note that because both the linear and non-linear burst sequences interleave between odd and even banks, SFI chip 860 will interleave between banks regardless of the sequence generated by burst logic 840 (be it linear or non-linear).

Asynchronous Main Memory Interface (AMMI) for Flash Main Memory

The synchronous flash interface (SFI) supports back to back data bursts thereby permitting flash memory to be used as main memory. There may be occasions, however, where system constraints prevent the use of the synchronous flash interface to a high speed synchronous bus. One such case is where there are already several components that are coupled to the high speed synchronous bus. In such a case, the additional coupling of the SFI chip (or its glue logic controller chip) will increase the capacitive load of the high speed synchronous bus to the point where it can no longer support a desired level of performance. Another such case is where the SFI chip requires a glue logic controller chip and the cost constraints imposed when designing the system prohibit the additional expense of this chip.

Furthermore, many portable systems do not have a local bus (i.e. do not have a high speed synchronous bus). Typically, in these systems, the CPU is integrated with the peripheral device controllers onto a single microprocessor chip. In such systems, only an asynchronous main memory bus and a relatively slow expansion bus are available within the system.

Asynchronous flash memory as it exists today must interface within these systems to the expansion bus through a custom controller. Bus cycles on the expansion bus are typically slow. Therefore, because each expansion bus cycle is typically longer than the asynchronous access time of a flash memory, the synchronous flash interface provides no real benefit when interfacing with the expansion bus.

An Asynchronous Main Memory Interface (AMMI) permits flash memory to interface to the asynchronous high speed main memory bus in any computer system. In effect, the AMMI permits a flash memory chip to emulate an asynchronous DRAM chip. In addition to providing a low cost, low power flash main memory, the AMMI also eliminates the time required to transfer programs or data from the hard disk to the DRAM by permitting nonvolatile flash memory to be used as main memory in place of volatile DRAM. Thus, as was the case with SFI, the CPU can execute programs directly out of a flash main memory without any degradation in performance when compared to volatile main memory.

Because the AMMI permits a flash chip to emulate a DRAM chip, the AMMI eliminates the need to have custom controllers. It provides a glueless interface to the existing DRAM controller of a system and thus reduces cost and loading on the local bus.

The AMMI improves system performance and provides an alternative to hard disks in portable computer systems. It also provides for faster execution out of flash with minimal change to the system architecture. Moreover, the system performance can be increased without requiring any additional peripheral logic.

Figure 9:
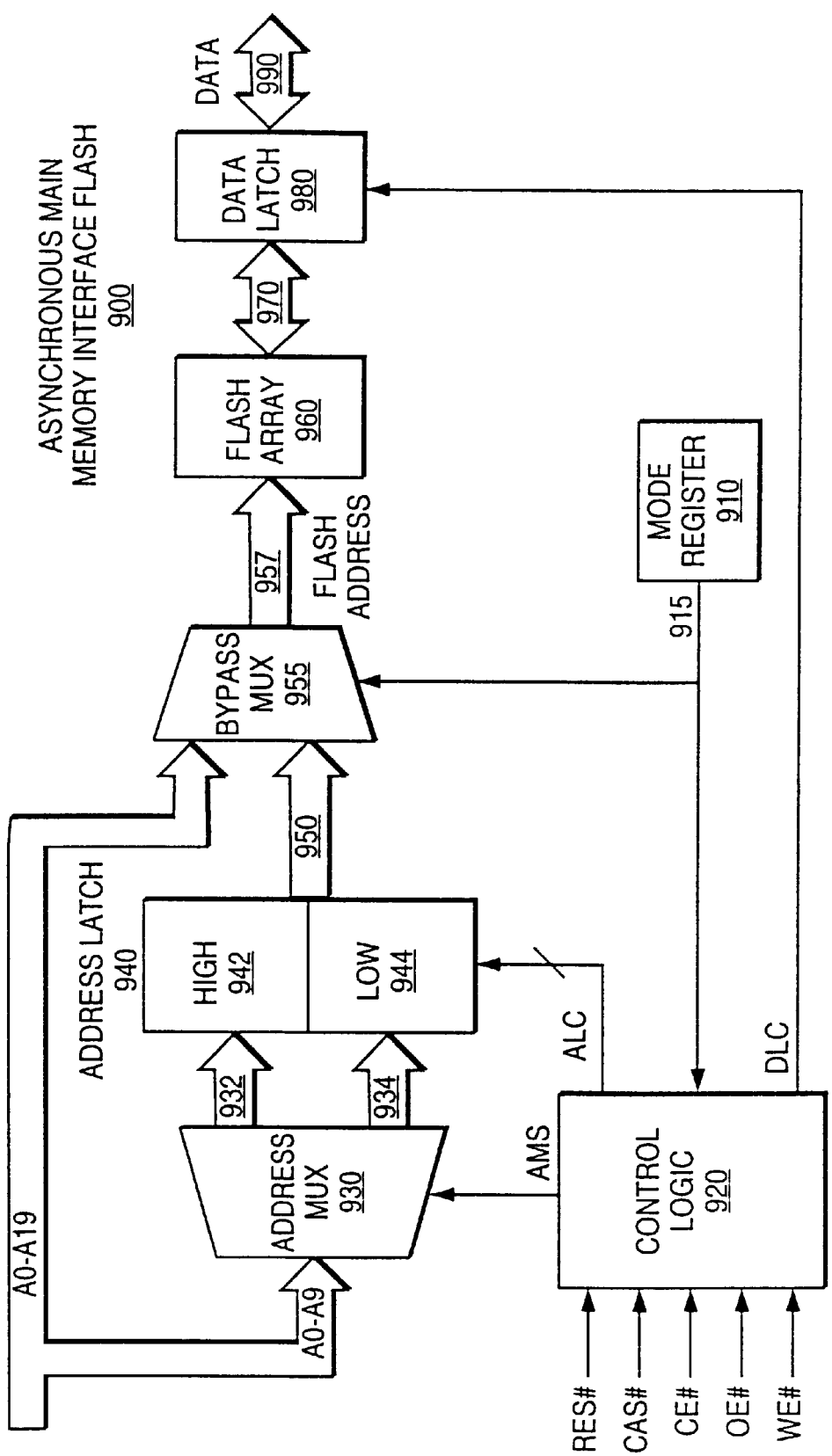
FIG. 9 is a block diagram of a flash memory integrated circuit having an asynchronous main memory interface.

FIG. 9 illustrates a block diagram of one embodiment of a flash memory chip having an asynchronous main memory interface. In the embodiment illustrated in FIG. 9, flash chip 900 can operate as a standard asynchronous flash memory chip or can emulate a DRAM. The particular addressing mode to be used is determined by whether mode register 910 has been set or not. Thus, if mode register 910 has been set to signify that an asynchronous main memory interface is desired, AMMI flash chip 900 will emulate a DRAM chip. On the other hand, if mode register 910 has not been set to signify that an asynchronous main memory interface is desired, AMMI flash chip 900 will not emulate a DRAM chip. In the latter case, the DRAM emulation circuitry of AMMI chip 900 would be disabled and AMMI flash chip 900 will operate as would a standard asynchronous flash memory chip. In one embodiment, mode register 910 is implemented using content addressable memory.

Figure 10:
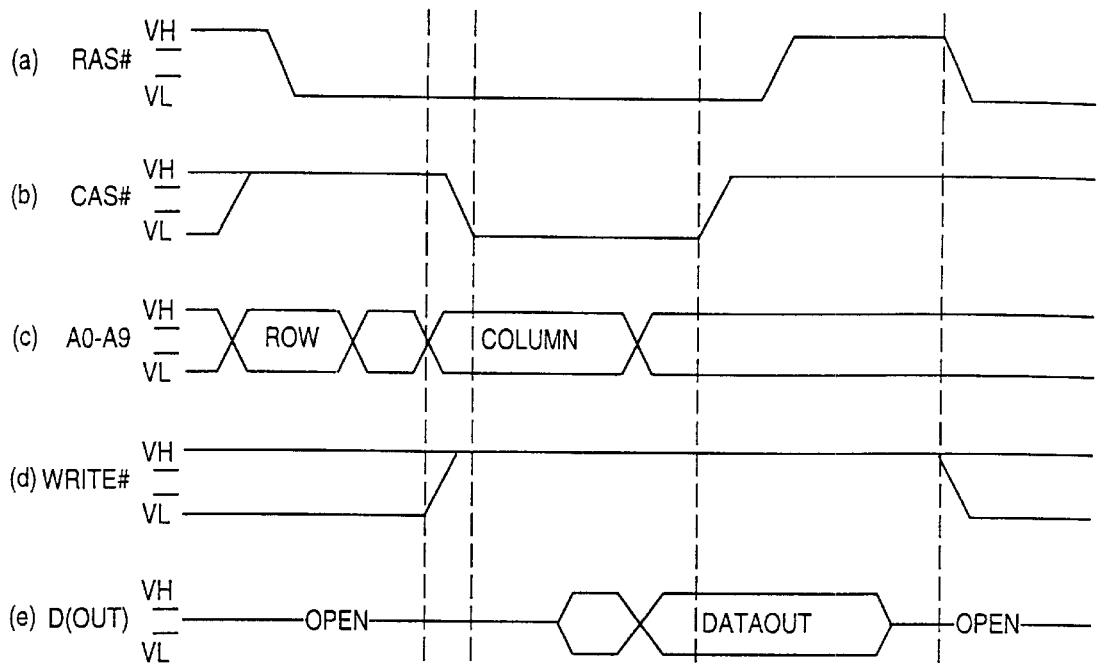
FIG. 10 is a timing diagram that illustrates a column and row address multiplexed asynchronous read cycle for a flash memory having an asynchronous main memory interface.

FIG. 10 illustrates a read cycle of an AMMI flash chip 900 when it is emulating a DRAM. Because the AMMI flash chip 900 is emulating a DRAM chip, FIG. 10 also illustrates a read cycle for a typical DRAM chip.

The asynchronous main memory interface provides a means of interpreting DRAM cycles and converting these cycles to a protocol that can be used to access a flash memory array. To reduce the pin count on a typical DRAM device, rather than using a single 20 bit address, as does flash, a DRAM multiplexes a ten bit row address and a ten bit column addresses. Address signal multiplexing for a DRAM is accomplished by providing two additional pins not found on a prior art asynchronous flash device.

Thus, in a DRAM, a Row Address Strobe (RAS#) pin and a Column Address Strobe (CAS#) pin are used to control the strobing in and latching of respective row and column addresses. Typically, these addresses are latched on the falling edges of these strobes and are used to access specific bits inside the DRAM array. Because AMMI flash memory chip 900 can emulate a DRAM chip, AMMI flash chip 900 has row and address pins for accepting row and column address strobe signals, respectively.

Some DRAM devices use row and column addresses that are not ten bits. For example, the row and column addresses of a DRAM device may only require eight bits to be expressed. Throughout the following discussion ten bit row and column addresses will be used. It is to be understood, however, that AMMI flash 900 can be practiced using other sized row and column addresses.

In FIG. 10 it can be seen that the read cycle for an AMMI flash chip 900 that is emulating a DRAM begins with the RAS# and CAS# signals both high and the multi-bit data output signal ($D_{OUT}$) open (tri-stated). The ten bit row address is then placed on the $A_0$ through $A_9$ address pins of the flash chip 900 and the RAS# signal is brought low to indicate that a valid address is to be strobed into the AMMI flash. (Note that in the case of an eight bit row address, the eight bit row address would be placed on the $A_0$ through $A_7$ address pins of the flash chip.)

After the row address has been strobed into AMMI flash chip 900, the RAS# signal continues to be held low for a predetermined period of time. In a standard DRAM, the RAS# signal is held high at the end of the read cycle prior to the next read cycle to precharge. Of course, because flash memory is not based on the capacitor-based storage technology of the DRAM, the flash array does not need the lengthy precharge time required by a DRAM. On the other hand, because AMMI flash 900 is emulating DRAM, it must react as would a DRAM.

Once the row address has been latched within AMMI flash chip 900, a read operation is signified by transitioning a WRITE# signal from low to high. Then, the ten bit column address is asserted on the $A_0$ through $A_9$ address pins of AMMI flash chip 900. Next, the CAS# signal is asserted and the column address is latched within AMNI flash chip 900. The ten bit row address and the ten bit column address are then combined within AMMI flash chip 900 to form a twenty bit address used to specify a location within the flash array to be read. Once read, the contents of the twenty bit address location are driven onto the data pins of AMMI flash chip 900 as multi-bit signal data out ($D_{OUT}$). Then, after a CAS# goes high, the multi-bit signal data out ($D_{OUT}$) is tri-stated again.

Meanwhile, after the row address has been strobed into AMMI flash chip 900 and the RAS# has been held low long enough for a row precharge to occur (if a DRAM was being accessed), the RAS# signal transitions back to high. The CAS# signal also transitions back to high after the column address has been strobed into AMMI flash chip 900.

Referring again to FIG. 9, the mode value stored within mode register 910 is provided to control logic 920. One output of control logic 920 is an address multiplexer select (AMS) signal. Signal AMS controls address multiplexer (mux) 930. Address mux 930, in turn, steers the ten bit address that is asserted on address pins $A_0$ through $A_9$ of AMMI flash 900 into the proper portion of address latch 940.

Address latch 940 is divided into a ten bit wide high portion 942 and a ten bit wide low portion 944 for storing, respectively, the ten high and low order bits of flash address 950. Demultiplexed address 950 is a twenty bit address used to address flash array 960. Another output from control logic 920 is a multi-bit address latch control (ALC) signal that controls the latching of addresses within the high portion 942 and the low portion 944 of address latch 940.

The mode value stored within mode register 910 is also provided to control bypass multiplexer (MUX) 955. The inputs to bypass multiplexer 955 are demultiplexed address 950 from address latch 940 and the twenty bit external flash address asserted on address pins $A_0$ through $A_{19}$ of the flash chip 900 when flash chip 900 is operating as a standard asynchronous flash chip. The output from bypass multiplexer 955 is flash address 957 that is provided to flash array 960.

Thus, when the AMMI flash chip 900 is operating as a standard asynchronous flash chip, a twenty bit flash address will be asserted on address pins $A_0$ through $A_{19}$ of the flash chip 900. Signal 915 from mode register 910 will set bypass multiplexer 955 to steer the twenty bit flash address asserted on address pins $A_0$ through $A_{19}$ of the flash chip 900 to flash array 960 as flash address 957.

Alternately, when AMMI chip 900 is emulating a DRAM chip, address pins $A_0$ through $A_9$ of flash chip 900 will be multiplexed. First, a ten bit row address will be placed on address pins $A_0$ through $A_9$ of flash chip 900 and the RAS# signal will indicate that the row address is ready to be strobed into the flash chip. Then, a ten bit column address will be placed on address pins $A_0$ through $A_9$ of flash chip 900 and the CAS# signal will indicate that the column address is ready to be strobed into the flash chip.

Note that in the DRAM emulation mode, no address signals will be placed on address pins $A_{10}$ through $A_{19}$ of the flash chip. Therefore, when the row address is to be strobed into AMMI flash device 900, control logic 930 will set address mux 920 to steer the ten bit row address that is asserted on address pins $A_0$ through $A_9$ of the flash chip into the low portion 944 of address latch 940. Signal ALC will then cause the ten bit row address that is asserted on address pins $A_0$ through $A_9$ of flash chip 900 to be latched by low portion 944 of address latch 940.

Later, when the CAS# signal indicates that the column address is to be strobed into AMMI flash device 900, control logic 930 will set address mux 920 to steer the ten bit column address that is asserted on address pins $A_0$ through $A_9$ of the flash chip into the high portion 942 of address latch 940. Signal ALC will then cause the ten bit column address that is asserted on address pins $A_0$ through $A_9$ of the flash chip to be latched by high portion 942 of address latch 940. In this way, the ten bit row address will be combined with the ten bit column address internally within AMMI flash memory 900 to form a twenty bit demultiplexed flash address 950 that is stored in latch 940 and can be used to address the flash array 960. Signal 915 from mode register 910 will set bypass multiplexer 955 to steer the twenty bit demultiplexed flash address 950 stored in address latch 940 to flash array 960 as flash address 957.

Regardless of whether the AMMI chip 900 is operating as a standard flash chip or is emulating a DRAM chip, once a complete twenty bit flash address 950 has been provided to flash array 960, the contents stored within flash array 960 at address 950 are then retrieved from flash array 960 and sent over bus 970 to data latch 980. Data latch control (DLC) signal from control logic 920 controls data latch 980. At the proper time, data latch 980 drives the data that has been read from flash array 960 out onto the data bus 990 (and data pins of AMMI flash 900). Then, at the completion of the read cycle, control logic 920 causes data latch 980 to tri-state. Other DRAM read accesses such as fast page mode are handled similarly.

In an alternate embodiment, AMMI flash chip 900 is a dedicated DRAM emulation device and cannot function as a standard flash chip. In this alternate embodiment, mode register 910 and address pins $A_{10}$ through $A_{19}$ of the flash chip are not required. This embodiment enables a lower pin count interface to AMMI chip 900 and is especially attractive to space constrained design situations.

Figure 11:
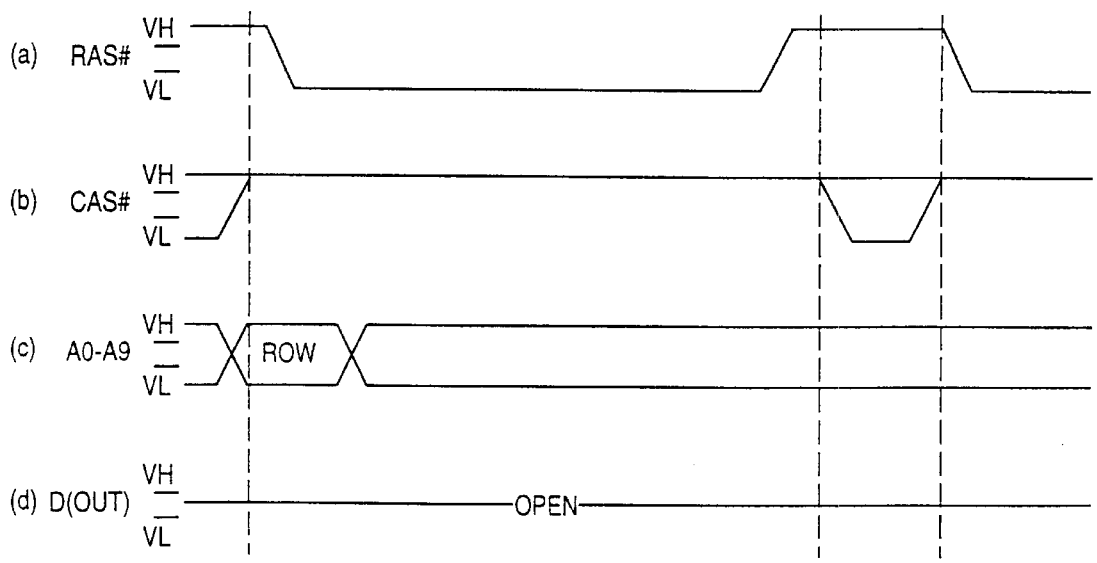
FIG. 11 is a timing diagram that illustrates a refresh cycle for a flash memory having an asynchronous main memory interface.

In addition, control logic 920 contains logic that is used to interpret DRAM cycles that are not needed for flash 900 when it is emulating a DRAM. As mentioned before, unlike DRAM, flash memory does not need to have an extensive precharge or the various refresh cycles commonly required by DRAM. FIG. 11 illustrates a typical refresh cycle for an AMMI flash chip that is emulating a DRAM. Because an AMNI flash chip that is emulating a DRAM will behave as would a DRAM chip, FIG. 11 illustrates a typical refresh cycle for a DRAM.

Note that the refresh cycle of FIG. 11 begins as does the read cycle of FIG. 10. Thus, at the beginning of the refresh cycle, the column address strobe signal (CAS#) is brought high and a row address is placed on address pins $A_0$ through $A_9$ of AMMI flash chip 900 while the row address strobe signal (RAS#) is brought low.

Unlike the read cycle of FIG. 10, however, during the refresh cycle of FIG. 11, after the row address (of the row to be refreshed) has been strobed into AMMI flash memory chip 900, no column address is strobed into the flash chip. Instead, the RAS# signal is held low for a period sufficiently long to permit the row specified to be refreshed (if a DRAM was being refreshed) and the CAS# signal is held high throughout this period. During the refresh cycle, the data pins of AMMI flash chip 900 remain open (tri-stated).

Referring again to FIG. 9, when in the DRAM emulation mode, control logic 920 will identify a refresh cycle pattern and hold data latch 980 tri-stated throughout the refresh cycle. Other standard refresh cycles (e.g. CAS before RAS (CBR) refresh, self-refresh and hidden refresh cycles) are well known in the art and handled similarly. In this manner, a glueless interface from the AMMI flash chip 900 to a DRAM controller is achieved.

Alternately, some of the inefficiency associated with emulation of a DRAM can be eliminated while the benefits of DRAM emulation are retained by controlling access to AMMI flash chip 900 using a DRAM controller that has been modified to compensate for the fact that some, if not all, of the "DRAM" that it is controlling is actually AMMI flash 900 that is emulating DRAM. In such a case, the multiplexing of row and column addresses to the AMMI flash chip 900 would be retained. The DRAM controller would be modified, however, so that the DRAM controller will not force AMI flash chip 900 to wait for a lengthy (and unnecessary) row precharge period to complete. The DRAM controller would also be modified to eliminate refresh cycles for the AMMI flash memory 900. That way the DRAM controller will not force AMMI flash chip 900 to be tied up during lengthy (and unnecessary) refresh cycles. Thus, in the case of a programmable DRAM controller, the DRAM controller can be programmed to generate DRAM control signals that have been optimized to access an AMMI flash chip 900. An example of a suitable programmable DRAM controller is described in U.S. Pat. No. 4,785,428, Programmable Memory Array Control Signals, Bajwa et al., issued Nov. 15, 1988.

Some programmable DRAM controllers permit more than one type of DRAM to be controlled simultaneously by the same controller even when each DRAM type being controlled has different timing cycles than the others. This is accomplished by having more than one bank of DRAM and permitting the controller to have different access cycle timings programmed for each bank. The DRAM are then grouped so that all of the DRAM in a particular bank are of the same type.

Thus, in an embodiment where a programmable controller can be programmed on a bank-by-bank basis, the AMMI flash memory 900 is placed in one bank and standard DRAM is placed in another bank. Then the programmable DRAM controller can be programmed to control the DRAM in the DRAM bank using standard DRAM timing cycles. The programmable controller can also be programmed to control the bank of AMMI flash memory 900 that is emulating DRAM in a way that has been optimized to meet the needs of AMMI flash memory 900.

Alternately, rather than using a programmable controller, a special non-programmable DRAM controller can be provided that has been optimized for access to AMMI flash memory 900. This special non-programmable controller could either control AMMI flash memory 900 exclusively, or could also control one or more banks of conventional DRAM.

In yet another alternate embodiment, a DRAM controller that has been designed to interface to a high speed synchronous bus (i.e. a local bus) can be used to control access to AMMI flash memory 900.

Programming an AMMI flash chip 900 that is emulating DRAM is performed in a fashion similar to writing to DRAM. As is the case with a read operation, the control logic 920 interprets the commands on the control pins of the flash chip and issues them in accordance to the protocol required by asynchronous main memory flash device 900.

Because programming (and erasing) flash memory takes longer than writing to DRAM, approaches similar to those mentioned earlier can be used to minimize the impact of the time required to program an AMMI flash device 900. For example, flash file system software can insert wait states whenever a write to AMMI flash 900 is required. The number of writes to the AMMI flash 900 memory can be significantly reduced by using the AMMI flash device 900 to store ROM-able programs and data that are infrequently changed and by supplementing the AMMI flash memory 900 with a memory technology that can be written to quickly. Alternately, a write cache can be provided to store information that is to be programmed into the AMMI flash 900. The programming of the AMMI flash 900 memory can then be performed in the background during what would otherwise be idle periods.

Figure 12:
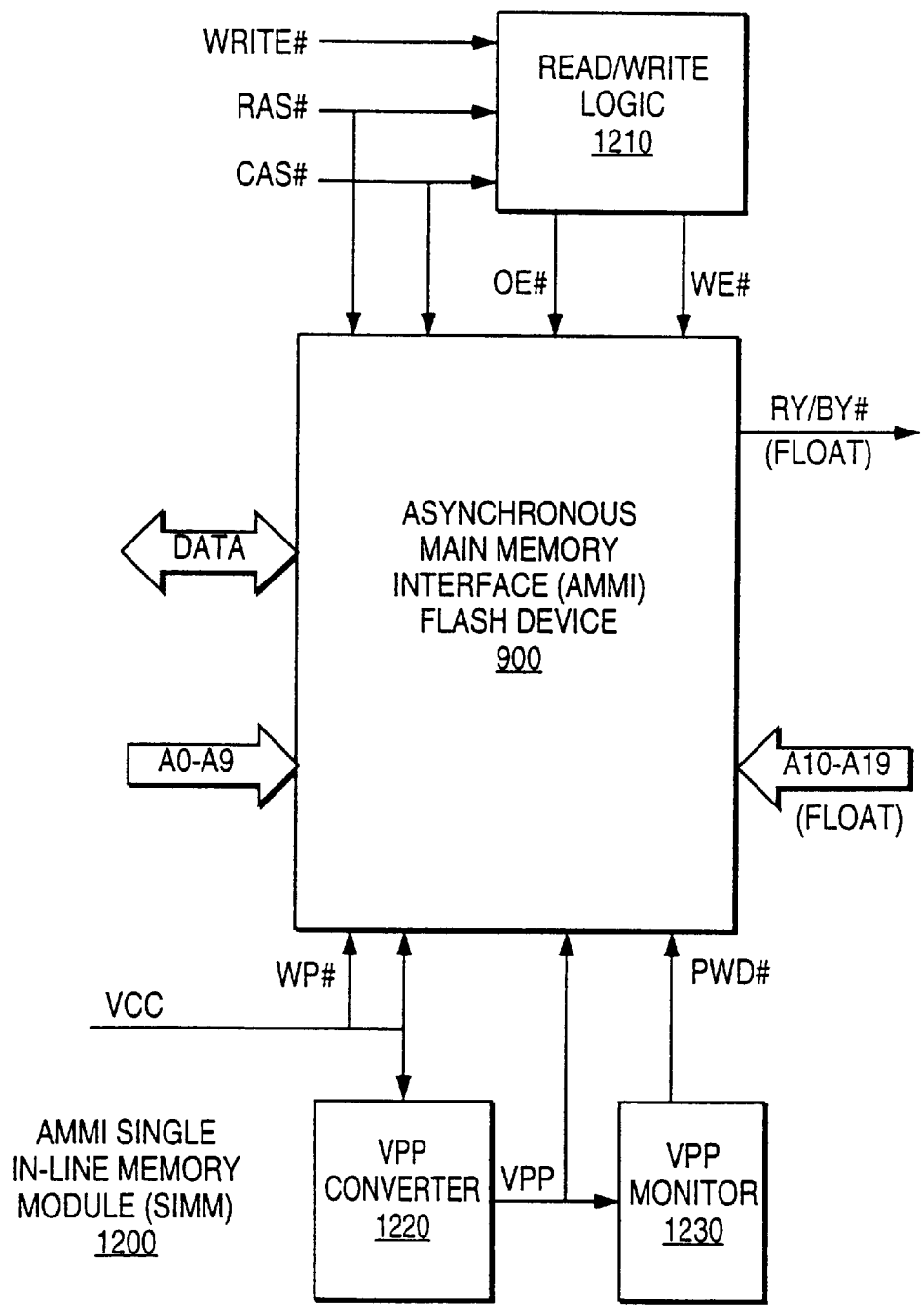
FIG. 12 is a block diagram of an asynchronous main memory interface single in-line memory module for the flash memory integrated circuit having the asynchronous main memory interface.

FIG. 12 illustrates a scheme for creating a DRAM-compatible SIMM using one or more AMMI flash memory chips. This scheme allows AMMI SIMM 1200 containing an AMMI flash memory chip 900 to plug directly into a SIMM socket intended for DRAM. Thus, a standard DRAM controller can control AMMI SIMM 1200. The AMMI SIMM enables the system to access data and direct-execute code stored in the flash memory 900 as if it were stored in DRAM while requiring no system hardware modification.

FIG. 12 illustrates an AMMI SIMM 1200 that is populated with a single AMMI flash chip 900. In an alternate embodiment, AMMI SIMM 1200 is populated with two or more AMMI flash memory chips 900.

An advantage of the AMMI flash chip 900 is that if a DRAM controller exists in the system, the hardware interface to the AMMI flash memory chip 900 is dramatically simplified by the ability of the AMMI chip to emulate a DRAM. AMMI SIMM 1200 further simplifies the addition of flash main memory into a computer system. This is because AMMI SIMM 1200 allows a DRAM controller to interface, not only to individual flash memory components, but also to an industry-standard SIMM containing one or more AMMI flash devices 900. All additional circuitry required for flash memory compatibility is included directly on the AMMI SIMM 1200.

When compared to a similar density DRAM chip, an AMMI flash memory chip 900 can have several extra pins. For example, the AMMI flash chip 900 may have a RY/BY# output pin to indicate when the chip is ready to be accessed and when the chip cannot be accessed because it is busy (for example, when the flash array is being programmed or when a flash block is being erased). Therefore, RY/BY# output pin of AMMI flash chip 900 on SIMM 1200 is simply not connected (i.e. is "floated"). Instead of using the RY/BY# pin to determine when AMMI flash chip 900 is ready or busy, system software is used to poll component status registers within chip 900 to determine the program/erase status of the chip.

When it is emulating a DRAM, AMMI flash chip 900 will multiplex row and addresses onto address pins $A_0$ through $A_9$ when they are strobed into chip 900. Therefore, address pins $A_{10}$ through $A_{19}$ are not used by AMMI flash chip 900 when it is part of AMMI SIMM 1100. Thus, address pins $A_{10}$ through $A_{19}$ of AMMI flash chip 900 are not connected when AMMI flash 900 is populating AMMI SIMM 1200.

The RAS# and CAS# signals are both provided directly to AMMI flash chip 900. They are also provided to read/write logic 1210 along with the DRAM WRITE# signal. The WRITE# signal indicates whether a read operation or a write operation is to be performed. Logic 1210 of AMMI SIMM 1200 translates the RAS#, CAS# and WRITE# signals provided to AMMI SIMM 1200 into appropriately timed output enable (OE#) and write enable (WE#) signals for AMMI flash chip 900.

Although not all flash memory chips require an external programming voltage (Vpp) supply, in the embodiment of FIG. 12, AMMI flash chip 900 requires an external Vpp (e.g. 12 Volts). Vpp is not provided to a SLMM as part of the standard SIMM interface. System operating voltage Vcc (e.g. 3.3 or 5 Volts), however, is provided to a SIMM as part of a standard SIMM interface. Therefore, in the embodiment of FIG. 12, Vpp converter 1220 is provided as part of AMMI SIMM 1200 to take the Vcc system operating voltage and convert it to a Vpp for AMMI flash chip 900. Suitable Vpp voltage converters 1220 are well known in the art and are commercially available. These voltage converters 1220 typically operate as DC-to-DC converters or as voltage pumps.

The WP# input of flash chip 900 is tied to the flash memory Vcc input. Vcc is also provided directly to AMMI chip 900.

Finally, the PWD# input for AMMI flash memory 900 is coupled to an on-SIMM programming voltage monitoring device 1230 such as the Maxim MAX705, manufactured by Maxim Integrated Products, Sunnyvale, Calif. The Vpp monitor circuit 1230 will hold AMMI flash memory 900 in Deep Powerdown mode unless the supply voltage is within tolerance, thereby protecting AMMI flash memory 900 from unintended writing or erasure.

This scheme allows AMMI SIMM 1200 containing AMMI flash memory 900 to use a Vpp program/erase voltage that is not part of a standard SIMM interface and yet also to plug directly into a SIMM socket intended for DRAM. Of course, in an alternate embodiment wherein AMMI flash memory chip 900 does not require the external supply of Vpp, AMMI SIMM 1200 will not require Vpp converter 1220. Vpp monitor 1230 would then be used to monitor Vcc.

For an embodiment wherein the SIMM pinout permits the addition of generate purpose input/output signals, one can switch off Vpp when not programming or erasing. One can also control signals RP# to provide power management and WP# to control block lock and unlock.

Figure 13:
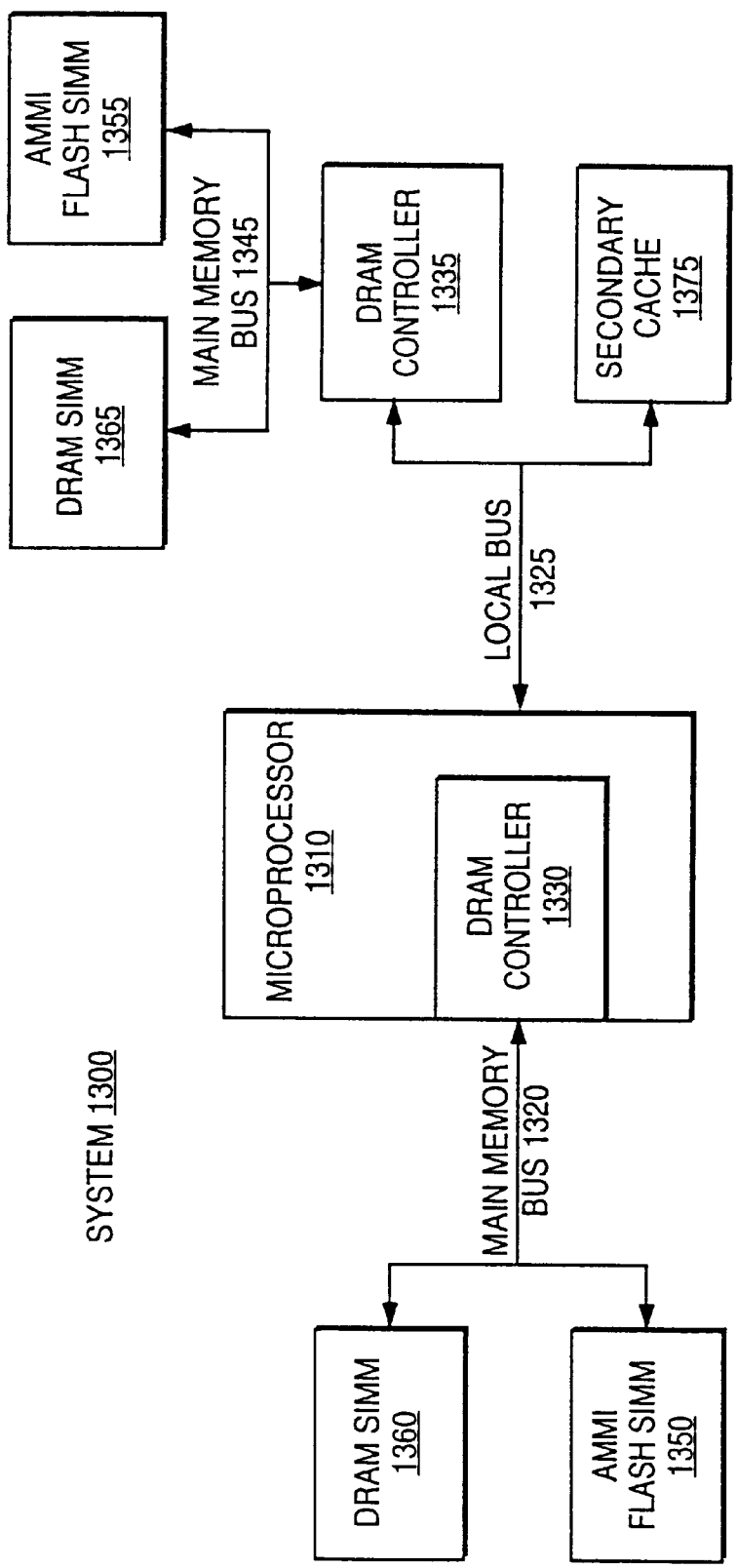
FIG. 13 is a block diagram of a computer system that uses a dynamic random access memory controller to access a flash memory based asynchronous main memory interface single in-line memory module.

FIG. 13 is a block diagram that illustrates the main memory organization of a computer system that uses AMMI flash SIMMs as main memory. In computer system 1300, microprocessor 1310 includes on-board DRAM controller 1330. DRAM controller 1330, in turn, is coupled to DRAM SIMM 1360 and AMMI flash SIMM 1350 by main memory bus 1320. DRAM SIMM 1360 and AMMI flash SIMM 1350 together form part of the main memory for microprocessor 1310.

When microprocessor 1310 is to access code or data stored in DRAM SIMM 1360 or AMMI flash SIMM 1350, DRAM controller 1330 of microprocessor 1310 will place an access request on main memory bus 1320. The access request will be made to DRAM SIMM 1360 or AMMI flash SIMM 1350 according to the asynchronous protocol of main memory bus 1320. Because AMMI flash SIMM 1350 contains one or more AMMI flash devices that are emulating an asynchronous DRAM device, DRAM controller 1330 will be able to access AMMI flash SIMM 1350 using a DRAM access protocol (i.e. by strobing row and column addresses). DRAM controller 1330 will also generate DRAM refresh cycles and provide precharge delays for AMMI flash SIMM 1350 even though a flash device in AMMI flash SIMM 1350 would not need them.

Furthermore, in computer system 1300, microprocessor 1310 is coupled to DRAM controller 1335 by high speed synchronous local bus 1325. DRAM controller 1335, in turn, is coupled to DRAM SLMM 1365 and AMMI flash SIMM 1355 by main memory bus 1345. DRAM SIMM 1365 and AMMI flash SIMM 1355 together form part of the main memory for microprocessor 1310.

When microprocessor 1310 is to access code or data stored in DRAM SIMM 1365 or AMMI flash SIMM 1355, microprocessor 1310 will place an access request on local bus 1325. The access request will be made according to the synchronous protocol of local bus 1325. DRAM controller 1335 will then interpret the access request and then make the access request to DRAM SIMM 1365 or AMMI flash SIMM 1355 using the protocol of main memory bus 1345. Because AMMI flash SIMM 1355 contains one or more AMMI flash devices that are emulating an asynchronous DRAM device, DRAM controller 1330 will be able to access AMMI flash SIMM 1355 using a DRAM access protocol (i.e. by strobing row and column addresses). DRAM controller 1335 will also generate DRAM refresh cycles and provide a precharge delay for AMMI flash SIMM 1350 even though a flash device in AMMI flash SIMM 1355 would not need them.

Secondary cache 1375 is also coupled to local bus 1325. If microprocessor 1310 attempts to access data or instructions from DRAM SIMMs 1360 or 1365 or AMMI flash SINMs 1350 or 1355 that are available in cache 1375, the access will be made to cache 1375 instead.

Note that alternate embodiments of computer system 1300 exist wherein computer system 1300 uses a subset of the main memory capability depicted in FIG. 13. Therefore, in one embodiment, microprocessor 1310 will address all of its main memory through main memory bus 1320. Alternately, microprocessor 1310 will address all of its main memory through local bus 1325. In such a case, microprocessor 1310 need not include on-board DRAM controller 1330.

In yet another embodiment, secondary cache 1375 is not available in system 1300. Furthermore, alternate embodiments exist wherein all of the main memory controlled by DRAM controller 1330 or DRAM controller 1335, is comprised of AMMI flash SIMMs 1350 or 1355, respectively. Moreover, in yet another embodiment, rather than being coupled directly to microprocessor 1310, local bus 1325 is coupled to main memory bus 1320 by a bus bridge.

Synchronous Main Memory Interface (SMMI) for Flash Main Memory

As processors have become faster, asynchronous DRAM has become increasingly unable to supply data and instructions to these processors at a speed fast enough to meet the processing speed sustainable by the processors. One recent solution has been the introduction of synchronous DRAM. Synchronous DRAM uses an external clock signal to synchronize interleaving within a DRAM integrated circuit and thereby provide a faster burst access than could be provided synchronously.

Figure 14:
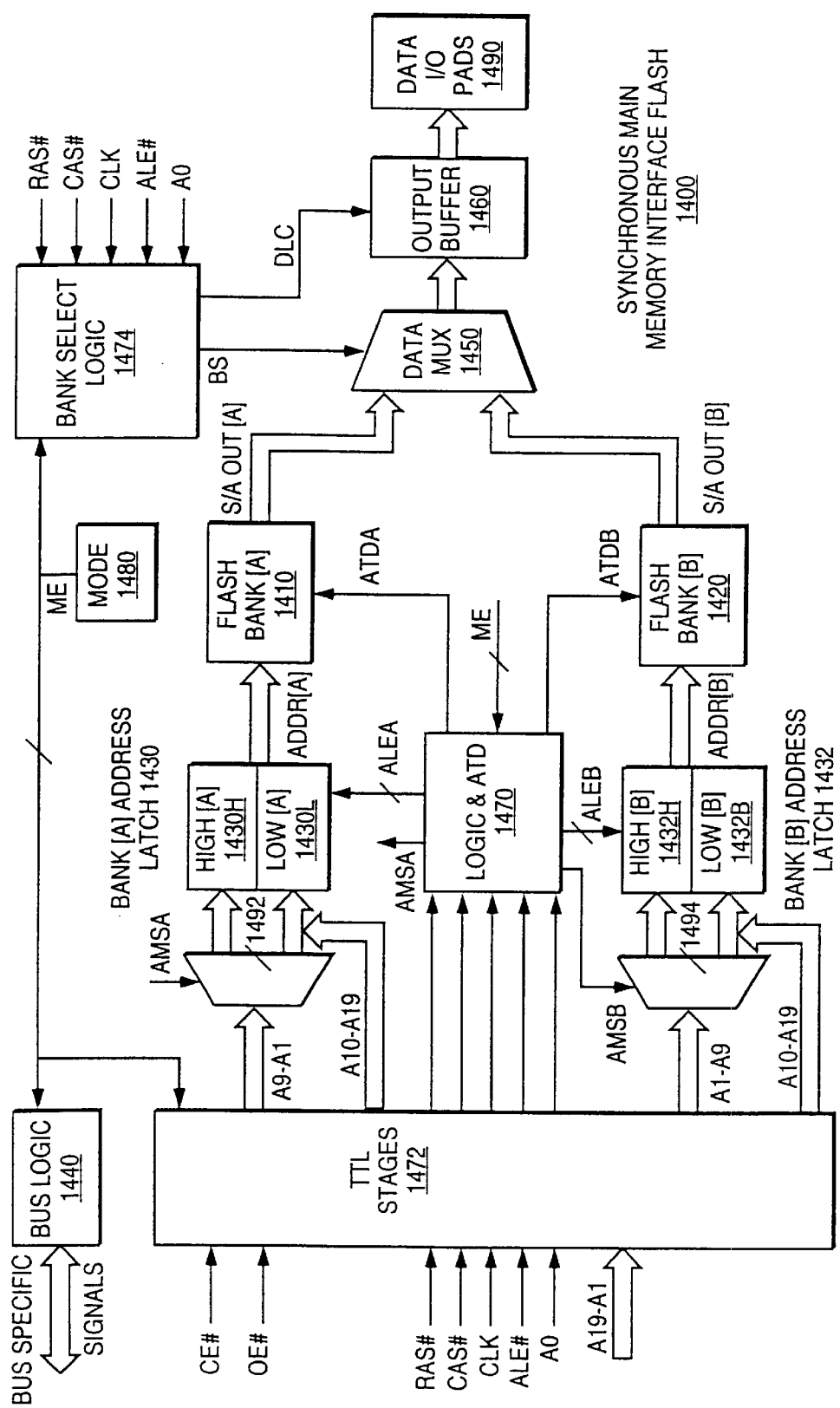
FIG. 14 is a block diagram of a flash memory integrated circuit having a synchronous main memory interface.

FIG. 14 illustrates a block diagram of a flash memory integrated circuit that is able to emulate a synchronous DRAM integrated circuit chip. In the embodiment depicted in FIG. 14, synchronous main memory interface (SMMI) flash memory unit 1400 combines the internal flash bank interlacing features of SFI flash 600 (FIG. 6) with the row and column address multiplexing of AMMI flash memory 900 (FIG. 9).

In the embodiment of SMMI flash 1400 depicted in FIG. 14, SMMI flash 1400 functions in one of four modes as determined by the setting of mode register 1480. In the first mode, asynchronous flash mode, the flash memory 1400 is read as a standard flash memory. In this mode, the reading of the contents of a first address must be completed before a second address to be read can be specified.

In the second mode, synchronous flash mode, a clock signal CLK is provided to SMMI flash chip 1400 and a series of addresses belonging to a data burst are specified, one address per clock tick. Then, the contents stored at the addresses specified for the burst are output sequentially during subsequent clock ticks in the order in which the addresses were provided. Alternately, if a single address is provided to SMMI flash chip 1400 when it is in the synchronous mode, the subsequent addresses for the burst will be generated within SMMI flash chip 1400 and the data burst will then be provided as output from the flash chip.

In the third mode, asynchronous DRAM (dynamic random access memory) mode, SMMI flash memory 1400 emulates asynchronous DRAM. Thus, row and column addresses are strobed into flash memory 1400 using row (RAS#) and column (CAS#) address strobe signals. SMMI flash memory 1400 then converts the row and column addresses internally into a single address and provides as output the data stored at that single address. Furthermore, although the SMMI flash memory 1400 does not need an extended precharge period or to be refreshed, when in the asynchronous DRAM mode, the flash memory 1400 responds to precharge periods and refresh cycles as would an asynchronous DRAM. Therefore, when in the asynchronous DRAM mode, SMMI flash memory 1400 can be controlled by a standard DRAM controller.

Finally, in the fourth mode, synchronous DRAM mode, the features of the second and third modes are combined to yield a flash memory that emulates a synchronous DRAM. Thus, addresses to be read as a data burst are specified by strobing row and column addresses into the flash memory using RAS# and CAS# signals. The data of the data burst is then provided sequentially as output from the flash memory on subsequent clock ticks.

In an alternate embodiment, SMMI flash 1400 only has one mode, synchronous DRAM emulation mode, or has synchronous DRAM mode and only one or two of the other modes.

In the four mode embodiment depicted in FIG. 14, mode register 1480 has a multi-bit output mode enable signal ME that reflects the current mode of SMMI flash 1400. Signal ME is provided to bank select logic 1474, bus logic 1440, TTL stages 1472 and logic and ATD control block 1470. These circuits control the function of SMMI flash 1400 differently according to the current mode of SMMI flash device 1400.

Thus, bus logic 1440 will function as does bus logic 640 of FIG. 6 when SMMI flash device 1400 is operating in synchronous flash mode and will be disabled in the other modes. Note that in an alternate embodiment wherein SMMI flash device 1400 is operating as a generic synchronous flash device, bus logic 1440 will not be part of chip 1400, but instead will be provided off chip.

When SMMI flash device 1400 is operating synchronously, in either the synchronous flash or synchronous DRAM emulation modes, TTL stages 1472, bank select logic 1474 and logic and ATD circuit 1470 will control the interlacing of accesses to flash banks A 1410 and B 1420. In an alternate embodiment, interlacing will be performed among more than two flash banks within SMMI flash device 1400 when it is placed in these synchronous modes.

Similarly, when SMMI flash device 1400 is emulating a DRAM, in either the asynchronous or synchronous DRAM emulation modes, TTL stages 1472, bank select logic 1474 and logic and ATD circuit 1470 will control the multiplexing of row and column addresses by address multiplexers 1492 and 1494 and the tri-stating of output buffer 1460.

A SMMI flash based synchronous SIMM can be formed using the techniques described above in connection with AMMI SIMM 1200 of FIG. 12. This would be accomplished by populating AMMI SIMM 1200 with one or more SMMI flash devices 1400 (rather than AMMI flash devices 900) and by providing a clock signal to each SMMI flash device.

Figure 15:
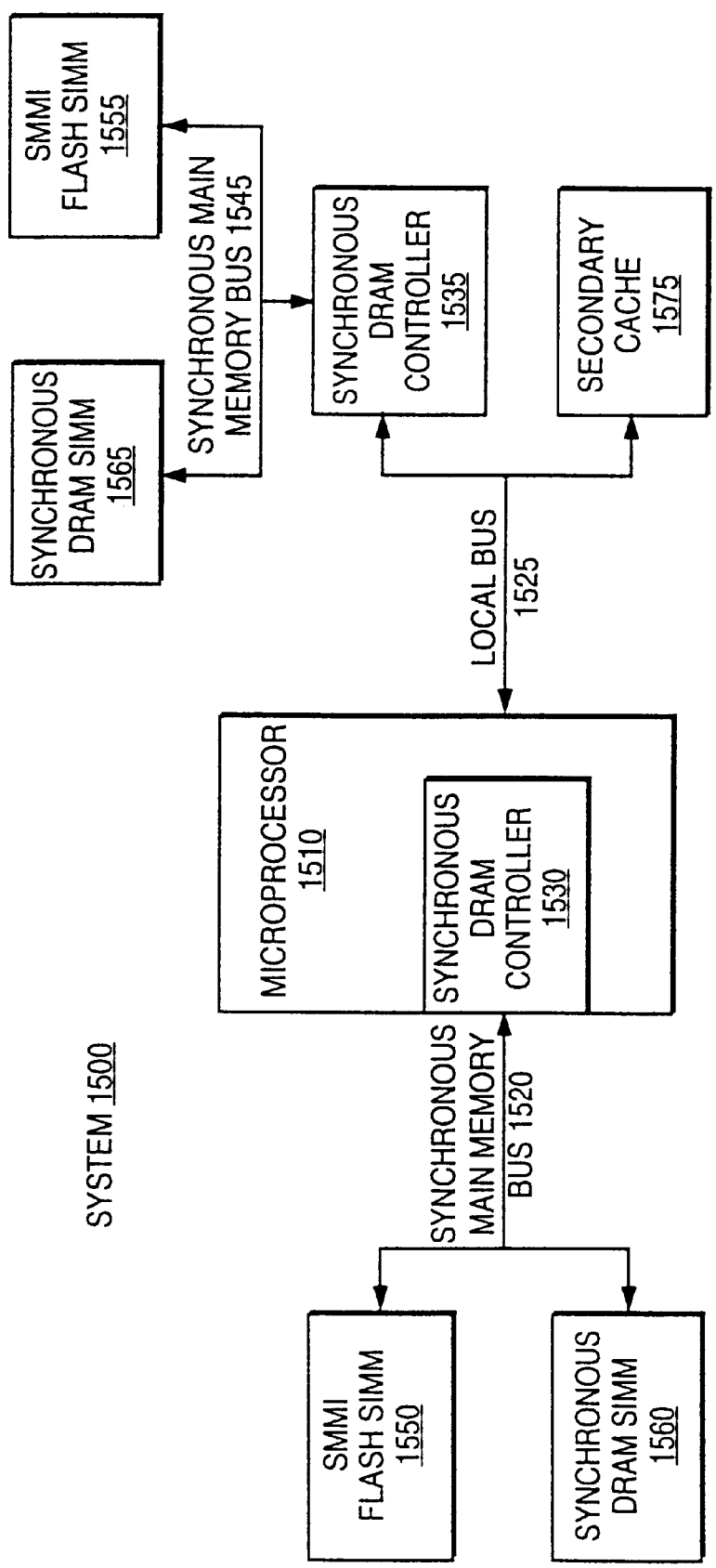
FIG. 15 is a block diagram of a computer system that uses a synchronous dynamic random access memory controller to access a flash memory based synchronous main memory interface single in-line memory module.

FIG. 15 is a block diagram that illustrates the main memory organization of a computer system that uses SMMI flash SIMMs as main memory. In computer system 1500, microprocessor 1510 includes on-board synchronous DRAM controller 1530. Synchronous DRAM controller 1530, in turn, is coupled to synchronous DRAM SIMM 1560 and SMMI flash SIMM 1550 by synchronous main memory bus 1520. Synchronous DRAM SIMM 1560 and SMMI flash SIMM 1550 together form part of the main memory for microprocessor 1510.

When microprocessor 1510 is to access code or data stored in synchronous DRAM SIMM 1560 or SMMI flash SIMM 1550, synchronous DRAM controller 1530 of microprocessor 1510 will place an access request on synchronous main memory bus 1520. The access request will be made to synchronous DRAM SIMM 1560 or SMMI flash SIMM 1550 according to the synchronous protocol of synchronous main memory bus 1520. Because SMMI flash SIMM 1550 contains one or more SMMI flash devices that are emulating a synchronous DRAM device, synchronous DRAM controller 1530 will be able to access SMMI flash SIMM 1550 using a synchronous DRAM access protocol (i.e. by strobing row and column addresses in conjunction with providing a clock signal). DRAM controller 1530 will also generate DRAM refresh cycles and provide precharge delays for SMMI flash SIMM 1550 even though a flash device in SMMI flash SIMM 1550 would not need them.

Furthermore, in computer system 1500, microprocessor 1510 is coupled to synchronous DRAM controller 1535 by high speed synchronous local bus 1525. Synchronous DRAM controller 1535, in turn, is coupled to synchronous DRAM SIMM 1565 and SMMI flash SIMM 1555 by synchronous main memory bus 1545. Synchronous DRAM SIMM 1565 and SMMI flash SIMM 1555 together form part of the main memory for microprocessor 1510.

When microprocessor 1510 is to access code or data stored in synchronous DRAM SIMM 1565 or SMMI flash SIMM 1555, microprocessor 1510 will place an access request on local bus 1525. The access request will be made according to the synchronous protocol of local bus 1525. Synchronous DRAM controller 1535 will then interpret the access request and then make the access request to synchronous DRAM SIMM 1565 or SMMI flash SIMM 1555 using the synchronous protocol of synchronous main memory bus 1545. Because SMMI flash SIMM 1555 contains one or more SMMI flash devices that are emulating a synchronous DRAM device, synchronous DRAM controller 1530 will be able to access SMMI flash SIMM 1555 using a synchronous DRAM access protocol (i.e. by strobing row and column addresses and by providing a clock signal). Synchronous DRAM controller 1535 will also generate synchronous DRAM refresh cycles and provide a precharge delay for SMMI flash SIMM 1550 even though a flash device in SMMI flash SIMM 1555 would not need them.

Secondary cache 1575 is also coupled to local bus 1525. If microprocessor 1510 attempts to access data or instructions from synchronous DRAM SIMMs 1560 or 1565 or SMMI flash SIMMs 155D or 1555 that are available in cache 157D, the access will be made to cache 1575 instead.

Note that alternate embodiments of computer system 1500 exist wherein computer system 1500 uses a subset of the main memory capability depicted in FIG. 15. Therefore, in one embodiment, microprocessor 1510 will address all of its main memory through main memory bus 1520. Alternately, microprocessor 1510 will address all of its main memory through local bus 1525. In such a case, microprocessor 1510 need not include on-board synchronous DRAM controller 1530.

In yet another embodiment, secondary cache 1575 is not available in system 1500. Furthermore, alternate embodiments exist wherein all of the main memory controlled by synchronous DRAM controller 1530 or synchronous DRAM controller 1535, is comprised of SMMI flash SIMMs 1550 or 1555, respectively. Moreover, in yet another embodiment, rather than being coupled directly to microprocessor 1510, local bus 1525 is coupled to main memory bus 1520 by a bus bridge.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A method comprising:
   a.) specifying a plurality of addresses corresponding to a data burst by receiving a plurality of multiplexed addresses and control signals including a first strobe signal and a second strobe signal, latching a first portion of a selected multiplexed address; and latching a second portion of the selected multiplexed address, wherein the first and second portions form a demultiplexed address;
   b.) reading data from a flash memory in accordance with the addresses;
   c.) providing the data in synchronization with a clock signal; and
   d.) repeating steps a) through c) in a burst read mode such that data stored at the plurality of addresses is provided sequentially during subsequent clock cycles.

2. The method of claim 1 wherein the first strobe signal is a row address signal, wherein latching a first portion of a selected multiplexed address is performed in response to the row address strobe signal.

3. The method of claim 1 wherein the second strobe signal is a column address signal, wherein latching a second portion of the selected multiplexed address is performed in response to the column address strobe signal.

4. The method of claim 1 further comprising the step of:
   e) providing a tristated output if the control signals indicate a refresh cycle.

5. The method of claim 4 wherein a sequence of the first and second strobe signals is indicative of the refresh cycle.

6. The method of claim 1 further comprising the step of:
   e) providing a tristated output memory if the control signals indicate a precharge cycle.

7. A method comprising:
   a.) specifying a beginning address of a plurality of addresses corresponding to a data burst by receiving a plurality of multiplexed addresses and control signals including a first strobe signal and a second strobe signal, latching a first portion of a selected multiplexed start address; and latching a second portion of the selected multiplexed start address, wherein the first and second portions form a demultiplexed address;
   b.) reading data from a flash memory in accordance with the addresses;
   c.) providing the data in synchronization with a clock signal;
   d.) generating a burst read address as the beginning address; and
   e.) repeating steps b) through d) in a burst read mode such that data stored at the plurality of addresses is provided sequentially, starting from the beginning address, during subsequent clock cycles.

8. The method of claim 7 wherein the first strobe signal is a row address signal, wherein latching a first portion of a selected multiplexed start address is performed in response to the row address strobe signal.

9. The method of claim 7 wherein the second strobe signal is a column address signal, wherein latching a second portion of the selected multiplexed start address is performed in response to the column address strobe signal.

10. The method of claim 7 further comprising the step of:
    f.) providing a tristated output if the control signals indicate a refresh cycle.

11. The method of claim 7 wherein a sequence of the first and second strobe signals is indicative of the refresh cycle.

12. The method of claim 7 further comprising the step of:
    f.) providing a tristated output memory if the control signals indicate a precharge cycle.

13. An apparatus comprising:
    a plurality of flash memory banks, wherein consecutive addresses are interlace among the plurality of flash memory banks; interlace control logic generating bank latch enable signals in accordance with received multiplexed address signals, asynchronous control signals, and synchronous control signals including a clock signal;
    a plurality of bank latches to provide addresses to the plurality of banks in accordance with the bank latch enable signals; and
    a mode register, wherein the interlace control logic provides synchronous access to the plurality of memory banks in accordance with the multiplexed address signals and synchronous control signals to provide synchronous burst read data on consecutive cycles of the clock signal if the mode register is storing a first value.

14. The apparatus of claim 13 formed within an integrated circuit.

15. The apparatus of claim 13 wherein the mode register is implemented with content addressable memory.

16. The apparatus of claim 13 wherein the first value is indicative of a synchronous dynamic random access memory (DRAM) mode of operation.

17. The apparatus of claim 13 wherein an output of the nonvolatile memory apparatus is tristated if the asynchronous control signals indicate a refresh cycle.

18. The apparatus of claim 13 wherein an output of the nonvolatile memory apparatus is tristated if the asynchronous control signals indicate a precharge cycle.

* * * * *